United States Patent
Snai et al.

(10) Patent No.: US 10,541,654 B1
(45) Date of Patent: Jan. 21, 2020

(54) AMPLIFICATION WITH POST-DISTORTION COMPENSATION

(71) Applicant: Qualcomm Incorporated, San Diego, CA (US)

(72) Inventors: Makar Snai, Burdwan (IN); Ehab Abdel Ghany, San Diego, CA (US); Manohar Seetharam, Bangalore (IN); Li-chung Chang, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/030,658

(22) Filed: Jul. 9, 2018

(51) Int. Cl.
| | |
|---|---|
| H03F 1/22 | (2006.01) |
| H03F 1/32 | (2006.01) |
| H03F 3/193 | (2006.01) |
| H03F 3/24 | (2006.01) |
| H04W 24/02 | (2009.01) |

(52) U.S. Cl.
CPC ........... *H03F 1/3205* (2013.01); *H03F 3/193* (2013.01); *H03F 3/245* (2013.01); *H03F 2200/165* (2013.01); *H03F 2200/171* (2013.01); *H03F 2200/294* (2013.01); *H03F 2200/451* (2013.01); *H04W 24/02* (2013.01)

(58) Field of Classification Search
CPC ............. H03F 1/22; H03F 1/223; H03F 1/226
USPC .......................................................... 330/311
See application file for complete search history.

(56) References Cited

U.S. PATENT DOCUMENTS

| | | | |
|---|---|---|---|
| 7,301,396 B1 | 11/2007 | Johnson et al. | |
| 7,853,235 B2 * | 12/2010 | Aparin | H03F 1/223 455/278.1 |
| 7,936,214 B2 | 5/2011 | Suetinov et al. | |
| 7,978,011 B1 | 7/2011 | Stevenson | |
| 2007/0018730 A1 * | 1/2007 | Zhan | H03F 1/22 330/311 |
| 2009/0174481 A1 * | 7/2009 | Chang | H03F 1/223 330/277 |

OTHER PUBLICATIONS

Kim T.S., et al., "Linearization of differential CMOS low noise amplifier using cross-coupled post distortion canceller" Radio Frequency Integrated Circuits Symposium, 2008. RFIC 2008. IEEE, IEEE, Piscataway, NJ, USA, Jun. 17, 2008 (Jun. 17, 2008), pp. 83-86, XP031284290 ISBN: 978-1-4244-1808-4 Section II; figures 1,3.

Vinaya M.M., et al., "A New PVT Compensation Technique Based on Current Comparison for Low-Voltage, Near Sub-Threshold LNA", IEEE Transactions on Circuits and Systems—I, Regular Papers, Dec. 2015, vol. 62, No. 12, pp. 2908-2919.

* cited by examiner

*Primary Examiner* — Steven J Mottola

(74) *Attorney, Agent, or Firm* — Colby Nipper/Qualcomm

(57) ABSTRACT

Amplification with post-distortion compensation is disclosed. In an example aspect, an apparatus includes a voltage rail and a cascode amplifier. The cascode amplifier includes an amplification node, a cascode node, and a common-source node. The cascode amplifier also includes at least one cascode transistor, an input transistor, and a compensation transistor. The cascode transistor is coupled between the amplification node and the cascode node. The input transistor is coupled between the cascode node and the common-source node. The compensation transistor is coupled between the voltage rail and the cascode node.

29 Claims, 13 Drawing Sheets

AMPLIFICATION WITH POST-DISTORTION COMPENSATION

TECHNICAL FIELD

This disclosure relates generally to electronic communications and, more specifically, to compensating for signal distortion in conjunction with signal amplification.

BACKGROUND

Electronic devices include traditional computing devices such as desktop computers, notebook computers, tablet computers, smartphones, wearable devices like a smartwatch, internet servers, and so forth. However, electronic devices also include other types of devices with computing power such as personal voice assistants, thermostats, automotive electronics, robotics, devices embedded in other machines like household appliances and industrial tools, Internet-of-Things (IoT) devices, and the like. These various electronic devices provide information, entertainment, social interaction, security, safety, productivity, transportation, manufacturing, and other services to human users. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet or a cellular network. Electronic communications therefore include both wireless and wired transmissions and receptions. To make electronic communications, an electronic device uses a transceiver, such as a wireless transceiver.

Typically, electronic devices use a wireless transceiver to communicate with wireless signals in accordance with some wireless standard. Examples of wireless standards include an IEEE 802.11 Wi-Fi standard and a Fourth Generation (4G) cellular standard, which we use today with smartphones and other connected devices. However, efforts to enable a Fifth Generation (5G) standard are ongoing. Next-generation 5G networks are expected to offer significantly higher bandwidths, lower latencies, and additional electromagnetic spectrum. Taken together, this means that exciting new wireless technologies can be provided, such as driverless vehicles, augmented reality, on-the-go 4K video streaming, omnipresent sensors to keep people safe and to use natural resources more efficiently, and so forth.

To enable these technologies, many additional wireless devices will be deployed, which is often called the "Internet of Things" (IoT). Compared to today's use of wireless devices, tens of billions, and eventually trillions, of more devices are expected to be connected to the internet with the arrival of the Internet of Things. These IoT devices may include small, inexpensive, and low-powered devices, like sensors and tracking tags. Thus, the transceivers that enable wireless communications with such IoT devices are likewise expected to be tiny, low-cost, and capable of functioning with less energy.

In other words, to facilitate the adoption of 5G technologies and the widespread deployment of IoT devices that will enable many new capabilities, IoT devices are expected to employ small, inexpensive, and power-efficient transceivers. Consequently, electrical engineers and other designers of electronic devices are striving to develop new transceivers that will enable the promise of 5G technologies to become a reality.

SUMMARY

An electronic device that implements amplification with post-distortion compensation is disclosed herein. Fifth-Generation (5G) wireless technologies are expected to provide a wealth of new services and features due to higher bandwidths, lower latencies, and the sheer number of devices that will be wirelessly interconnected, which is referred to as the Internet of Things (IoT). To make this a reality, many 5G wireless devices will need to be relatively smaller and less expensive. Due to these size and cost constraints, large off-chip filters are not practical for the wireless transceivers of some IoT devices. This can result in signal distortion, including second-harmonic distortion (HD2), as a byproduct of signal amplification. Instead of relying on large and costly filters, example implementations create a compensation current to counteract a second-harmonic portion of a signal current that would otherwise cause distortion at an output of an amplifier. Thus, a similar signal quality can be achieved with an amplifier using a smaller and less expensive approach to handling signal distortion.

In an example aspect, an apparatus for amplification includes an amplifier with amplification circuitry and compensation circuitry. The amplification circuitry is configured to produce an amplified signal based on an input signal. The amplification circuitry includes a cascode node, input amplification circuitry, and cascode amplification circuitry. The input amplification circuitry is coupled to the cascode node and is configured to accept the input signal and to produce an input current at the cascode node based on the input signal. The cascode amplification circuitry is coupled to the cascode node and is configured to produce the amplified signal based on a cascode current at the cascode node. The compensation circuitry is also coupled to the cascode node. The compensation circuitry is configured to produce a compensation current and to apply the compensation current to the amplification circuitry via the cascode node to counteract a component of the input current.

In an example aspect, an amplifier includes amplification circuitry configured to produce an amplified signal based on an input signal. The amplification circuitry includes a cascode node, input amplification circuitry, and cascode amplification circuitry. The input amplification circuitry is coupled to the cascode node. The input amplification circuitry is configured to accept the input signal and produce an input current at the cascode node based on the input signal. The input current includes a second-order input current. The cascode amplification circuitry is coupled to the cascode node and is configured to produce the amplified signal based on a cascode current at the cascode node. The amplifier also includes compensation means for compensating for the second-order input current of the input amplification circuitry via the cascode node.

In an example aspect, a method for amplification with post-distortion compensation is disclosed. The method includes accepting an input signal at an input transistor. Based on the input signal, an input current is produced at a cascode node using the input transistor, with the input current including a second-order input current. The method also includes causing, based on the input current, a cascode current at the cascode node using a cascode transistor. The method additionally includes applying a compensation current at the cascode node to counteract the second-order input current. The method further includes producing an amplified signal based on the cascode current.

In an example aspect, an apparatus for amplification includes a voltage rail and a cascode amplifier. The cascode amplifier includes an amplification node, a cascode node, and a common-source node. The cascode amplifier also includes at least one cascode transistor, an input transistor, and a compensation transistor. The cascode transistor is coupled between the amplification node and the cascode node. The input transistor is coupled between the cascode node and the common-source node. The compensation transistor is coupled between the voltage rail and the cascode node.

BRIEF DESCRIPTION OF DRAWINGS

FIGS. 8-1 and 8-2 illustrate example implementations of a controller of compensation circuitry for amplification with post-distortion compensation.

FIGS. 9-1 and 9-2 illustrate example implementations of phase shift circuitry of compensation circuitry for amplification with post-distortion compensation.

DETAILED DESCRIPTION

Figure 1:
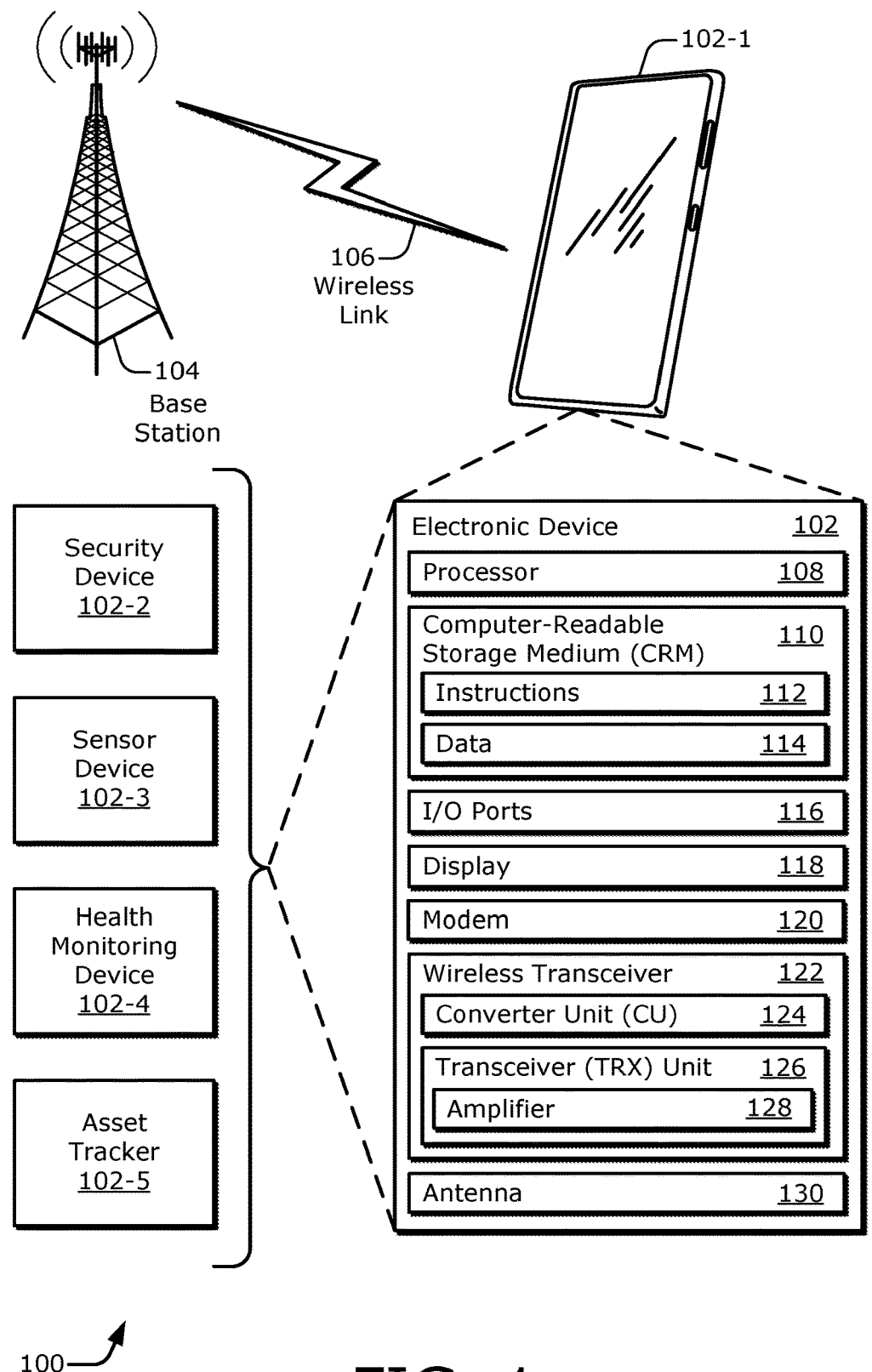
FIG. 1 illustrates an example environment that includes an electronic device having a wireless transceiver in which amplification with post-distortion compensation can be implemented.

The arrival of 5G wireless systems will bring many new communication possibilities due to the increased bandwidth, greater available spectrum, and lower latency afforded by the implementation of a 5G wireless standard, such as one created by the 3rd Generation Partnership Project (3GPP). Some of these 5G 3GPP standards include ones directed to smaller, less-expensive, or battery-powered devices. For example, to standardize wireless communications for IoT devices, 3GPP standards include a "Cat-M1" specification for machine or mobility-oriented devices and a "NB-IoT/Cat-NB1" specification for narrowband communications. Examples of devices to which these standards may apply include wearable devices, asset trackers, vending machines, health monitors, security devices, parking meters, utility meters, general sensors, agriculture and game monitors, and lighting/HVAC controllers.

These 3GPP specifications enforce stringent provisions for the rejection of out-of-band (OOB) jammers to achieve compliance certification. For example, to be compliant with the specification, a device is required to meet a stringent 64 dBc rejection of an OOB jammer (e.g., a signal or signal component at a FLO/2 frequency—which is half a frequency of a desired in-band signal). Off-chip filtering components can be used to meet such rejection requirements. Examples of these types of filtering components include surface and bulk acoustic wave (SAW/BAW) filters and duplexers. However, employing such off-chip filtering components to handle OOB jammers is not feasible for some cost-sensitive or size-limited applications, including many types of IoT devices.

To address these issues, example devices and techniques that are described herein can enable stringent rejection requirements to be met without using a large, expensive, or off-chip component. Described devices and techniques involve an amplifier that implements post-distortion compensation. Due, for instance, to a component that processes a signal prior to the amplifier, the signal can develop a jamming component at a harmonic of the frequency of interest. An example of such an OOB jamming harmonic (e.g., a second-order harmonic) is referred to herein as a FLO/2 jammer. Instead of using an expensive or large filter for every potential OOB jammer prior to amplification of the signal, the amplifier includes post-distortion compensation circuitry to handle the OOB jammer.

In operation, an amplifier amplifies an input signal, including the desired portion and the FLO/2 jammer portion. The FLO/2 jammer portion is therefore also amplified, which creates a distortion that adversely affects the resulting amplified signal. In such cases, the amplifier can suffer from a spurious in-band component as second-order distortion (HD2). This second-order distortion adversely affects the signal passed to components that are downstream of the amplifier along a transmit or receive chain of a wireless transceiver.

In some amplifiers, the second-order distortion is realized as a second-order current within the amplifier. Accordingly, some described example implementations of post-distortion compensation circuitry produce a compensation current that is approximately equal in magnitude and opposite in phase to this second-order current to counteract (e.g., substantially cancel) the second-order current and thereby appreciably reduce the second-order distortion. For example, some implementations are directed to a cascode amplifier including two levels. These two levels correspond to input amplification circuitry and cascode amplification circuitry, which are coupled to each other at a cascode node. The input amplification circuitry provides an input current with a second-order component at the cascode node. Compensation circuitry sources a compensation current and applies the compensation current to the cascode node to counteract the second-order portion of the input current, or second-order input current. As a result, a cascode current of the cascode amplification circuitry has a second-order component that is significantly reduced in magnitude. In an example scenario, a controller selectively activates the compensation circuitry to produce the compensation current based on a band (e.g., a frequency range) of a signal being amplified for transmission or reception purposes.

In these manners, an amplifier can meet certain standards, such as a stringent OOB jammer rejection requirement, without relying on a large or expensive external component. Instead, the amplifier sources a compensation current that corresponds to a post-distortion current resulting from a jammer signal component. The amplifier applies the compensation current to the post-distortion current to counteract the jammer signal component. Several implementations are described below in terms of a low-noise amplifier (LNA) that is part of a receive chain of a transceiver that is suitable for implementation in a low-cost IoT device. However, the post-distortion compensation techniques that are described herein can be implemented in other types of amplifiers, including those that function as part of a transmit chain, and in other types of devices, including larger, more complex, or more expensive ones.

FIG. 1 illustrates an example environment 100 that includes an electronic device 102 in which amplification with post-distortion compensation can be implemented. In the environment 100, the electronic device 102 communicates with a base station 104 through a wireless communication link 106 (wireless link 106). As shown, the electronic device 102 is depicted as a smart phone 102-1. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet-of-Things (IoT) device, and so forth. For example, the electronic device 102 may be implemented as a relatively smaller or lower-powered device, including an IoT device. Other depicted examples of the electronic device 102 include a security device 102-2 (e.g., a motion-activated camera), a sensor device 102-3 (e.g., a utility meter with remote reporting), a health monitoring device 102-4 (e.g., a glucose monitor), and an asset tracker 102-5 (e.g., that is affixed to a rentable bicycle).

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, cable television head-end, terrestrial television broadcast tower, access point, peer-to-peer device, mesh network node, fiber optic line, another electronic device generally, and so forth. Hence, the electronic device 102 may communicate with the base station 104 or another device via a wired connection, a wireless connection, or a combination thereof. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

The electronic device 102 includes a processor 108 and a computer-readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 can be realized as a screen or projection that presents graphics of the electronic device 102, such as a user interface associated with an operating system, program, or application. Alternatively or additionally, the display 118 may be implemented as a display port or virtual interface through which graphical content of the electronic device 102 is communicated or presented.

For communication purposes, the electronic device 102 also includes a modem 120, a wireless transceiver 122, and an antenna 130. The wireless transceiver 122 provides connectivity to respective networks and other electronic devices connected therewith using radio-frequency (RF) wireless signals. Additionally or alternatively, the electronic device 102 may include a wired transceiver, such as an Ethernet or fiber optic interface for communicating over a personal or local network, an intranet, or the Internet. The wireless transceiver 122 may facilitate communication over any suitable type of wireless network, such as a wireless local area network (LAN) (WLAN), a peer-to-peer (P2P) network, a mesh network, a cellular network, a wireless wide-area-network (WWAN), a navigational network (e.g., the Global Positioning System (GPS) of North America or another Global Navigation Satellite System (GNSS)), and/or a wireless personal-area-network (WPAN). In the context of the example environment 100, the wireless transceiver 122 enables the electronic device 102 to communicate with the base station 104 and networks connected therewith. However, other figures referenced herein may pertain to alternative wireless networks.

The modem 120, such as a baseband modem, may be implemented as a system on-chip (SoC) that provides a digital communication interface for data, voice, messaging, and other applications of the electronic device 102. The modem 120 may also include baseband circuitry to perform high-rate sampling processes that can include analog-to-digital conversion (ADC), digital-to-analog conversion (DAC), gain correction, skew correction, frequency translation, and so forth. The modem 120 may also include logic to perform in-phase/quadrature (I/Q) operations, such as synthesis, encoding, modulation, demodulation, and decoding. More generally, the modem 120 may be realized as a digital signal processor (DSP) or a communications-oriented processor that is configured to perform signal processing to support communications via one or more networks. Alternatively, ADC or DAC operations may be performed by a separate component or another illustrated component, such as the wireless transceiver 122 as shown.

The wireless transceiver 122 can include circuitry, logic, and other hardware for transmitting or receiving a wireless signal for at least one communication frequency band. In operation, the wireless transceiver 122 can implement at least one, e.g., radio-frequency transceiver unit to process data and/or signals associated with communicating data of the electronic device 102 via the antenna 130. Generally, the wireless transceiver 122 can include filters, switches, amplifiers, mixers, and so forth for routing and conditioning signals that are transmitted or received via the antenna 130. As shown, the wireless transceiver 122 includes at least one converter unit 124 (CU) (e.g., for ADC or DAC operations) and at least one transceiver unit 126 (TRX unit). The transceiver unit 126 includes at least one amplifier 128.

In some cases, components of the wireless transceiver 122, or a transceiver unit 126 thereof, are implemented as separate receiver and transmitter entities. Additionally or alternatively, the wireless transceiver 122 can be realized using multiple or different sections to implement respective receiving and transmitting operations (e.g., using separate receive and transmit chains). Example implementations of a transceiver unit 126, including the amplifier 128, are described below with reference to FIG. 2. Example implementations of the amplifier 128 are described with reference to FIG. 3. The amplifier 128 can operate to at least partially implement amplification with post-distortion compensation.

Figure 2:
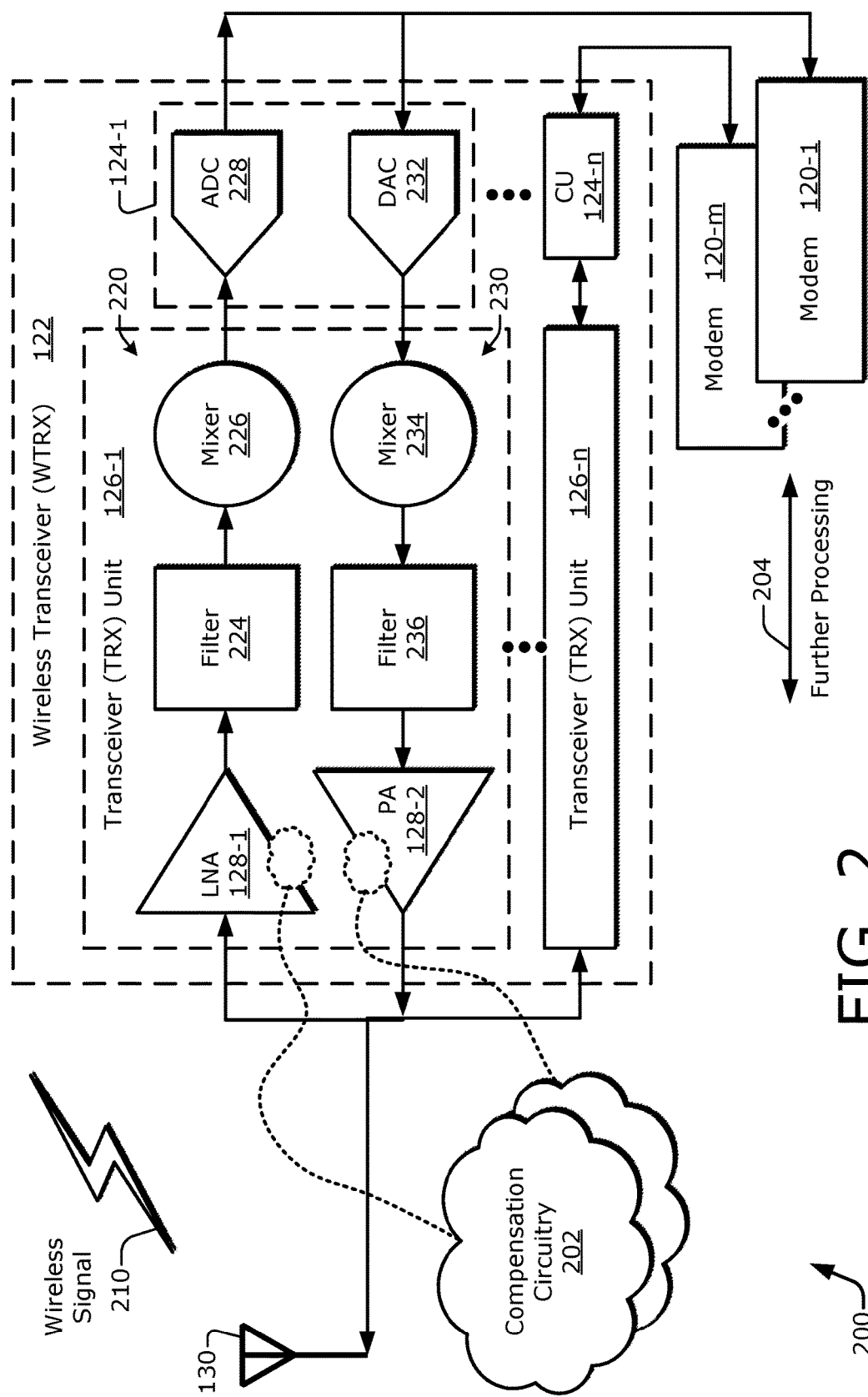
FIG. 2 illustrates an example wireless transceiver that includes two types of amplifiers that can include compensation circuitry with which amplification with post-distortion compensation can be implemented.

FIG. 2 illustrates, at 200, an example of a wireless transceiver 122 that includes an amplifier 128 that can implement amplification with post-distortion compensation. The amplifier 128 can be implemented as a low-noise amplifier 128-1 (LNA 128-1), a power amplifier 128-2 (PA 128-2), or another kind of amplifier. As illustrated from left to right, the antenna 130 is coupled to the wireless transceiver 122, and the wireless transceiver 122 is coupled to at least one modem 120. The wireless transceiver 122 includes one or more transceiver units 126-1 . . . 126-n, with "n" representing a positive integer. In some devices, each of the multiple wireless transceiver units 122-1 to 122-n is coupled to at least one of multiple modems 120-1 . . . 120-m, with "m" representing a positive integer.

Thus, in FIG. 2, multiple transceiver units 126-1 to 126-n are shown. As part of the wireless transceiver 122 (WTRX), each transceiver unit 126-1 to 126-n is respectively coupled to an associated converter unit 124 (CU) of multiple converter units 124-1 . . . 124-n. Each converter unit 124, as depicted at the converter unit 124-1, can include an analog-to-digital converter 228 (ADC) or a digital-to-analog converter 232 (DAC). As shown, the transceiver unit 126-1 is coupled to the modem 120-1 (e.g., via the converter unit 124-1), and the transceiver unit 126-n is coupled to the modem 120-m. However, multiple transceiver units 126 can be coupled to a same modem 120. Although only certain components are explicitly depicted in FIG. 2, the wireless transceiver 122 may include other components. Further, the converter units 124-1 to 124-n may be separate from the wireless transceiver 122, such as by being independent or a part of a modem 120.

The transceiver unit 126-1 includes a receiver 220 (or receive chain) and a transmitter 230 (or transmit chain). The receiver 220 includes the low-noise amplifier 128-1, a filter 224, and a mixer 226 for frequency down-conversion. The transmitter 230 includes a mixer 234 for up-conversion, a filter 236, and the power amplifier 128-2. However, the transceiver unit 126-1 can include other components, such as additional amplifiers or filters or multiple mixers, that are disposed anywhere along the depicted receive and transmit chains. These example components can at least partially implement a radio-frequency front-end (RFFE) for the associated electronic device 102. In some implementations, compensation circuitry 202 is included with the low-noise amplifier 128-1 or the power amplifier 128-2 for amplification with post-distortion compensation.

As shown for the receiver 220 of the transceiver unit 126-1, the antenna 130 is coupled to the low-noise amplifier 128-1, and the low-noise amplifier 128-1 is coupled to the filter 224. The filter 224 is coupled to the mixer 226, and the mixer 226 is coupled to the ADC 228. The ADC 228 is coupled to, or is part of, the modem 120-1. As shown for the transmit chain, the DAC 232 is coupled to, or is part of, the modem 120-1. The DAC 232 is also coupled to the transmitter 230 of the transceiver unit 126-1 via the mixer 234. The mixer 234 is coupled to the filter 236, and the filter 236 is coupled to the power amplifier 128-2. The power amplifier 128-2 is coupled to the antenna 130. The antenna 130 is also coupled to the transceiver unit 126-n, and the transceiver unit 126-n is coupled to the converter unit 124-n, which is coupled to the modem 120-m. Although only one antenna is shown, an electronic device 102 can include multiple antennas or an antenna array.

An example signal-receiving operation that includes the receiver 220 of the transceiver unit 126-1 is now described. As part of the signal-receiving operation, the antenna 130 receives a wireless signal 210. The antenna 130 can be implemented as, e.g., a diversity antenna. The antenna 130 provides the wireless signal 210 to at least one selected transceiver unit 126, which is the transceiver unit 126-1 here. Thus, the antenna 130 provides the wireless signal 210 as an incoming signal to the low-noise amplifier 128-1 of the transceiver unit 126-1. The low-noise amplifier 128-1 amplifies the signal to produce an amplified outgoing signal. The low-noise amplifier 128-1 provides the amplified outgoing signal to the filter 224. The filter 224 filters (e.g., low-pass filters or bandpass filters) the amplified signal by attenuating some range or ranges of frequencies to produce a filtered signal that has one or more frequency bands attenuated. The filter 224 provides the filtered signal to the mixer 226.

The mixer 226 performs a frequency conversion operation on the filtered signal to down-convert from one frequency to a lower frequency, such as from a radio frequency (RF) to an intermediate frequency (IF) or to a baseband frequency (BBF). The mixer 226 can perform the frequency down-conversion in a single conversion step, or through multiple conversion steps. Thus, the mixer 226 performs a frequency down-conversion operation on the filtered signal to produce a down-converted signal and provides the down-converted signal to the ADC 228. The ADC 228 converts the analog down-converted signal to a digital signal. The ADC 228 provides the digital signal to the modem 120-1. The modem 120-1 can perform demodulation, decoding, and so forth on the digital signal to produce a data signal. The modem 120-1 then provides the data signal to other components, such as a device processor, for further processing at 204 (e.g., for processing at an application level).

As part of an example signal-transmitting operation, the DAC 232 receives a digital signal from the modem 120-1. The DAC 232 converts the digital signal to an analog signal, which is at a baseband or intermediate frequency. The mixer 234 accepts the analog signal from the DAC 232 and upconverts the analog signal to a higher frequency, such as an RF frequency to produce an RF signal. The mixer 234 provides the RF signal to the filter 236. The filter 236 filters the RF signal to attenuate one or more frequency ranges and produces a filtered signal, which is provided to the power amplifier 128-2 as an incoming signal. The power amplifier 128-2 amplifies the filtered signal to generate an amplified outgoing signal. The power amplifier 128-2 provides the amplified outgoing signal to the antenna 130 for emanation as the wireless signal 210.

Although certain components are depicted at 200, the receiver 220 or the transmitter 230 may include different components, more or fewer components, or an alternative order of components. For example, another filter or another mixer may be disposed along the receive chain between the antenna 130 and the low-noise amplifier 128-1 such that a received wireless signal 210 is partially processed prior to being routed to the low-noise amplifier 128-1.

As illustrated in FIG. 2, either or both of the low-noise amplifier 128-1 and the power amplifier 128-2 may include compensation circuitry 202. The compensation circuitry 202 can implement amplification with post-distortion compensation as described herein. Thus, the compensation circuitry 202 can be implemented as part of a low-noise amplifier 128-1, a power amplifier 128-2, or another amplifier 128 of a wireless transceiver 122. However, the compensation circuitry 202 can be implemented in alternative manners. For example, the compensation circuitry 202 may be included in other components or other integrated circuits and modules of an electronic device 102, such as a modem, a wired transceiver, and so forth.

Figure 3:
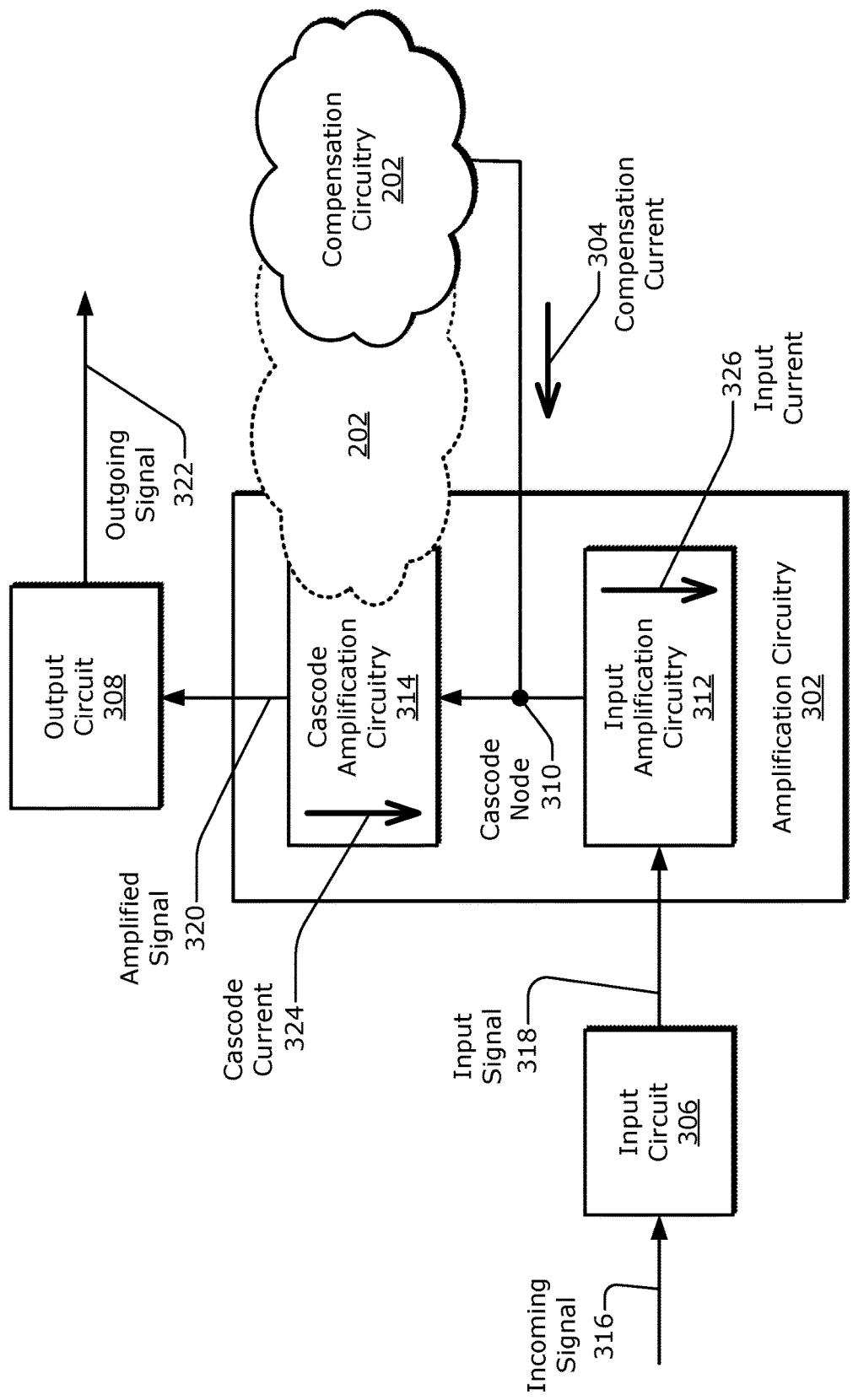
FIG. 3 is a schematic diagram illustrating an example amplifier including amplification circuitry and associated compensation circuitry.

FIG. 3 is a schematic diagram illustrating an example amplifier 128 including amplification circuitry 302 and associated compensation circuitry 202. As illustrated, the amplifier 128 also includes an input circuit 306 and an output circuit 308. The amplification circuitry 302 includes input amplification circuitry 312 and cascode amplification circuitry 314. The amplifier 128 can be part of a receiver 220 or a transmitter 230 (of FIG. 2). As part of a receive chain or a transmit chain, the amplifier 128 accepts an incoming signal 316, amplifies the incoming signal 316, and forwards an amplified version of the incoming signal as the outgoing signal 322.

In operation, the input circuit 306 accepts an incoming signal 316 and provides an input signal 318 based on the incoming signal 316. The input circuit 306 can obtain the incoming signal 316 from an upstream component, such as a filter, a mixer, a converter unit, or an antenna. To do so, the input circuit 306 can include one or more components to provide impedance matching with the upstream component. The input circuit 306 provides the input signal 318 to the amplification circuitry 302.

The amplification circuitry 302 amplifies the input signal 318 to produce an amplified signal 320. The amplification circuitry 302 provides the amplified signal 320 to the output circuit 308. The output circuit 308 accepts the amplified signal 320 and produces an outgoing signal 322 based on the amplified signal 320. The output circuit 308 forwards the outgoing signal 322 to a downstream component, such as a filter, a mixer, a converter unit, or an antenna. To facilitate coupling to a downstream component, the output circuit 308 can include one or more components to provide impedance matching with the downstream component.

In some aspects, the amplifier 128 is implemented as a cascode amplifier having at least two levels: a first level with a transconductance part and a second level with a load part. For a two-level cascode amplifier, the first level includes input amplification circuitry 312, and the second level includes cascode amplification circuitry 314. The input amplification circuitry 312 is coupled in series with the cascode amplification circuitry 314 with a cascode node 310 disposed therebetween. The input amplification circuitry 312 is coupled between the input circuit 306 and the cascode node 310. Thus, the input amplification circuitry 312 receives the input signal 318 from the input circuit 306. The cascode amplification circuitry 314 is coupled between the cascode node 310 and the output circuit 308. Thus, the cascode amplification circuitry 314 provides the amplified signal 320 to the output circuit 308.

The input signal 318, which can have an undesired frequency component, is provided to the input amplification circuitry 312. The input amplification circuitry 312 has first, second, third, and so forth amplification responses. The second-order amplification by the input amplification circuitry 312 causes an undesired second-order harmonic response as well as a first-order response of a desired frequency or frequency band. Thus, the input amplification circuitry 312 of the amplification circuitry 302 can produce a distorted amplified signal due to the second-order response. Without the compensation circuitry 202, this can result in second-order harmonic distortion (HD2) in the amplified signal 320. However, in example implementations, the compensation circuitry 202 is configured to compensate for the second-order harmonic distortion using a compensation current 304.

The input amplification circuitry 312 is configured to accept the input signal 318 and produce an input current 326 at the cascode node 310 based on the input signal 318. The input current 326 can, for example, flow through a transistor of the input amplification circuitry 312 responsive to a voltage that is input to the transistor. Thus, an input voltage can be converted to an input current via a transconductance amplification process, which is described further below with reference to FIG. 7. The cascode amplification circuitry 314 is coupled to the cascode node 310 and is configured to produce the amplified signal 320 based on a cascode current 324 at the cascode node 310. The cascode current 324 is susceptible to having a second-order current thereof cause second-order harmonic distortion in the amplified signal 320 if the techniques described herein are not implemented. As described herein, there is a relationship between the input current 326 and the cascode current 324.

Figure 4:
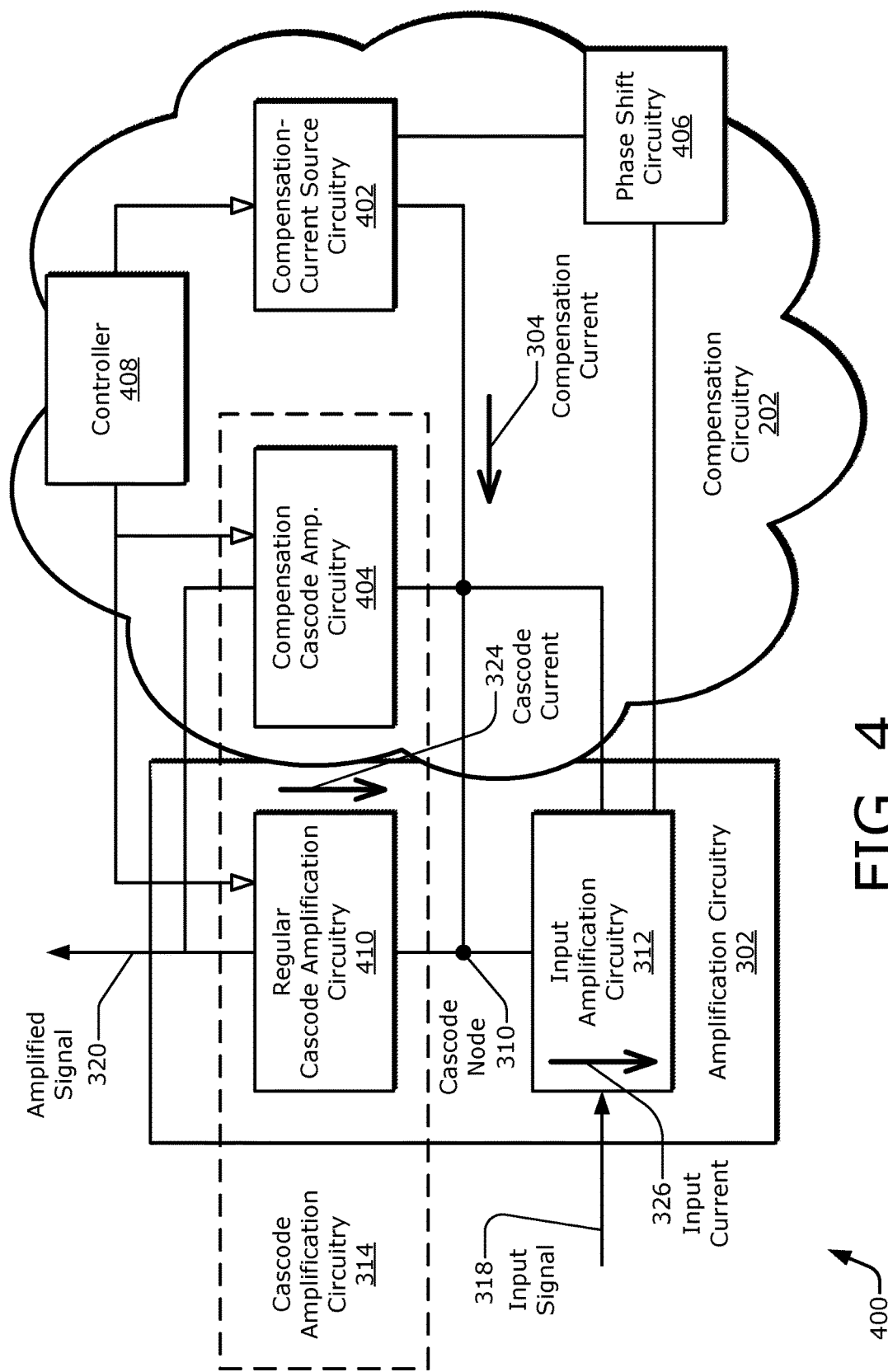
FIG. 4 is a schematic diagram illustrating example compensation circuitry along with example amplification circuitry that includes input amplification circuitry and cascode amplification circuitry.

To combat the potential second-order harmonic distortion, the compensation circuitry 202 sources (e.g., causes to flow) the compensation current 304 and applies the compensation current 304 to the amplification circuitry 302 via the cascode node 310. Thus, there is a relationship between the input current 326, the cascode current 324, and the compensation current 304. In operation, the compensation circuitry 202 can counteract the second-order input current of the input current 326 by substantially canceling the second-order input current via the cascode node 310. The compensation circuitry 202 can therefore provide a compensation mechanism for compensating for the second-order input current of the input current 326 of the input amplification circuitry 312 via the cascode node 310. The applied compensation current 304 counteracts the second-order harmonic distortion in a current domain of the amplification circuitry 302 as described further below with reference to FIG. 7. In FIG. 3, the compensation circuitry 202 is depicted as a cloud that can extend into the cascode amplification circuitry 314. In the description of FIG. 4 below, example approaches are described in which part of the compensation circuitry 202 is integrated with the cascode amplification circuitry 314.

FIG. 4 is a schematic diagram 400 illustrating example compensation circuitry 202 along with example amplification circuitry 302 that includes the input amplification circuitry 312 and the cascode amplification circuitry 314. In example implementations, the compensation circuitry 202 includes compensation-current source circuitry 402, compensation cascode amplification circuitry 404, phase shift circuitry 406, and a controller 408. In addition to the input amplification circuitry 312, the amplification circuitry 302 can include regular cascode amplification circuitry 410 as depicted here. Further, the cascode amplification circuitry 314 can be realized using the regular cascode amplification circuitry 410 or the compensation cascode amplification circuitry 404. In such cases, in addition to forming a part of the compensation circuitry 202, the compensation cascode amplification circuitry 404 can form a part of the amplification circuitry 302 by virtue of being part of the cascode amplification circuitry 314.

The regular cascode amplification circuitry 410 and the compensation cascode amplification circuitry 404 are each coupled to the cascode node 310. The phase shift circuitry 406 is coupled to the compensation-current source circuitry 402 and the input amplification circuitry 312 (e.g., via the cascode node 310 or a ground node (not shown in FIG. 4)). The controller 408 is coupled to the compensation-current source circuitry 402, the compensation cascode amplification circuitry 404, and the regular cascode amplification circuitry 410.

In example operations, the compensation-current source circuitry 402 is configured to source the compensation current 304. The compensation-current source circuitry 402 applies (e.g., injects) the compensation current 304 to the amplification circuitry 302, via the cascode node 310 for example. Thus, the compensation-current source circuitry 402 can provide a production mechanism for producing a compensation current 304 to counteract a second-order input current of the input current 326 of the input amplification circuitry 312 at the cascode node 310. The phase shift circuitry 406 is configured to shift a phase of the compensation current 304 to align the compensation current 304 with at least one current of the amplification circuitry 302 that is to be counteracted by the compensation circuitry 202 (e.g., the input current 326 that includes a second-order component that can adversely impact the cascode current 324). Thus, the phase shift circuitry 406 can provide a phase shift mechanism for aligning a phase of the compensation current 304 with a phase of the second-order input current of the input current 326.

In some implementations, an amplifier is configured to operate in multiple modes, such as a first mode and a second mode. In a first mode, compensation functionality is not desired, so the compensation circuitry 202 is inactive. The first mode may be relevant to, for instance, a frequency band for which an undesirable harmonic is attenuated prior to amplification of an associated signal. For example, a notch filter (e.g., a resistive-capacitive (RC) bandpass filter) can be disposed prior to the input amplification circuitry 312, such as before, after, or part of the input circuit 306 of FIG. 3. This notch filter can attenuate the harmonic of a first band. Accordingly, the controller 408 can deactivate the compensation circuitry 202 at the compensation-current source circuitry 402 and the compensation cascode amplification circuitry 404. Further, the controller 408 can activate the regular cascode amplification circuitry 410. With the regular cascode amplification circuitry 410 activated, the regular cascode amplification circuitry 410 produces the cascode current 324.

In contrast, the compensation circuitry 202 is active for a second mode in which compensation functionality is desired. For a second band corresponding to the second mode, there may be inadequate preamplification filtering of an undesired harmonic or relatively greater second-order amplification of an undesired frequency band. Consequently, a second-order component of a current may be amplified, thereby creating second-order harmonic distortion in a signal. The harmonic-distortion compensation can therefore be applied in a post-distortion manner but prior to signal information propagating to the amplified signal 320. To do so, the controller 408 deactivates the regular cascode amplification circuitry 410 and activates the compensation cascode amplification circuitry 404 and the compensation-current source circuitry 402. With the compensation cascode amplification circuitry 404 activated, the compensation cascode amplification circuitry 404 produces the cascode current 324. Thus, the compensation cascode amplification circuitry 404 can provide an amplification mechanism for producing the cascode current 324 at the cascode node 310, with the amplification mechanism also comprising a part of the compensation circuitry 202. Also, the controller 408 can therefore provide a control mechanism for controlling activation of the compensation functionality by switching between the regular cascode amplification circuitry 410 and the compensation cascode amplification circuitry 404, as well as activating the compensation-current source circuitry 402.

Figure 7:
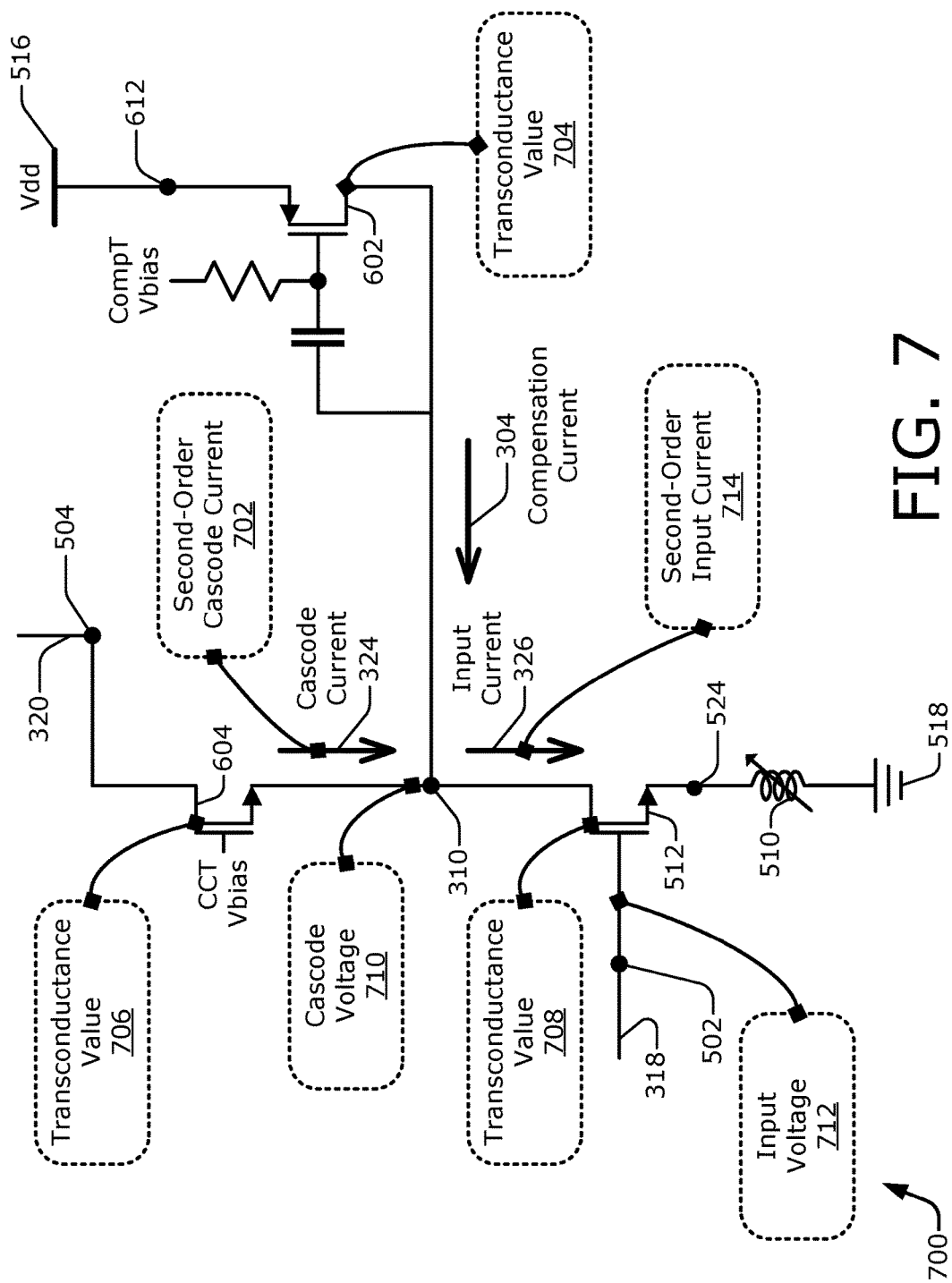
FIG. 7 illustrates example current flows with respect to a cascode node, including a compensation current that can be used to implement amplification with post-distortion compensation.
Figures 1, 8:
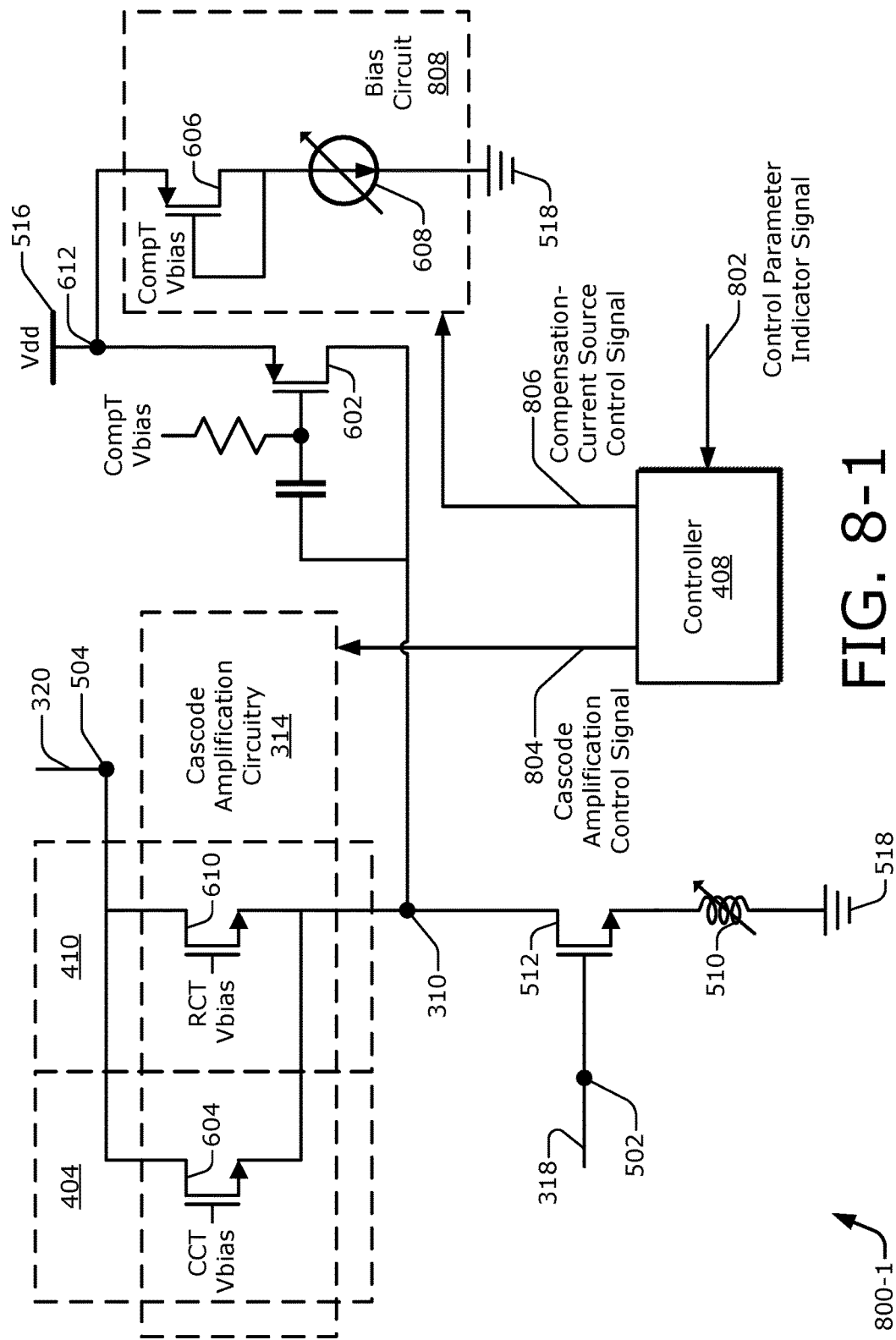
Figures 2, 8:
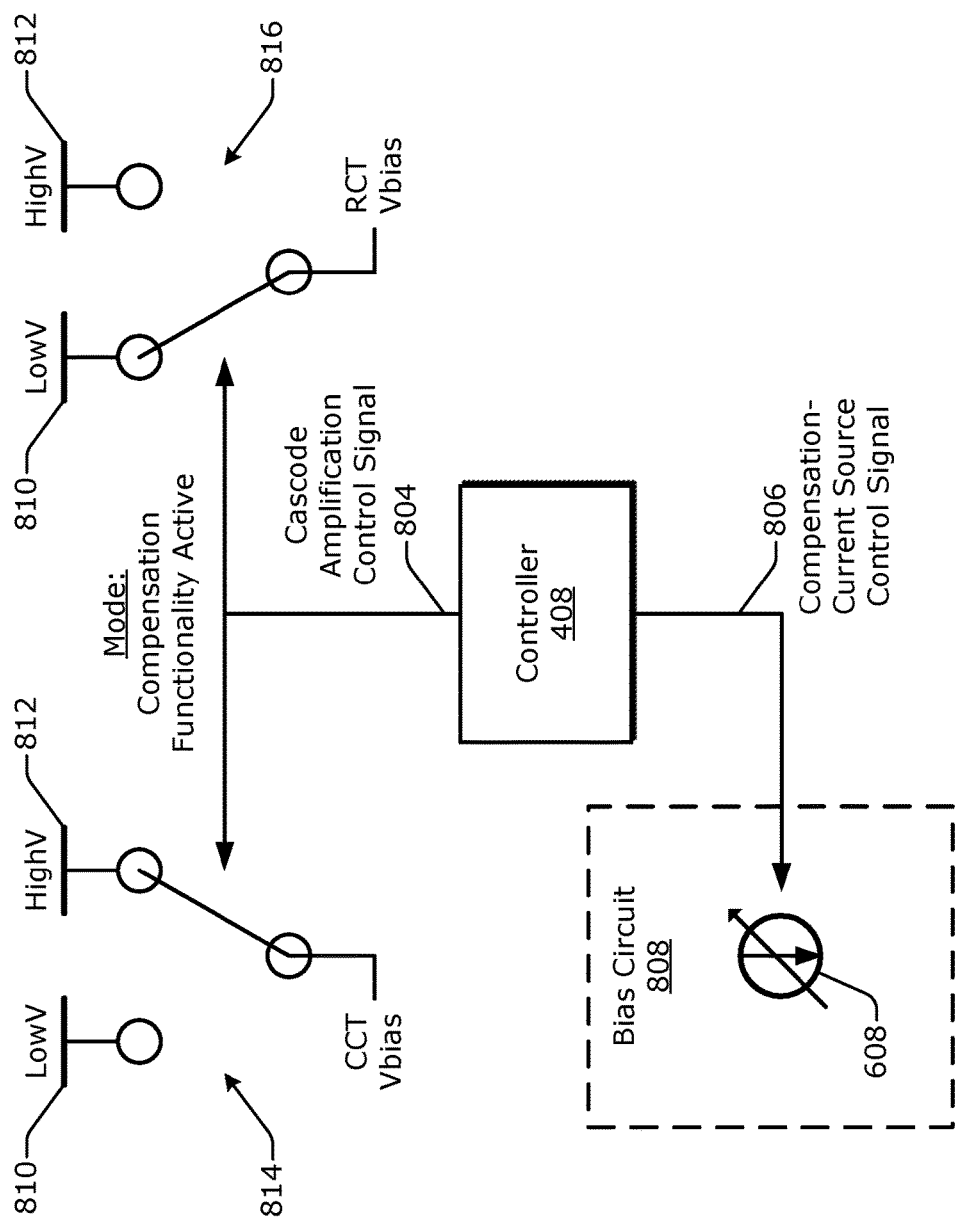

An example circuit diagram for the input amplification circuitry 312 and the cascode amplification circuitry 314, as well as the input circuit 306 and the output circuit 308 (of FIG. 3), is described below with reference to FIG. 5. The description of FIG. 6 additionally includes example circuit-level components of the regular cascode amplification circuitry 410, the compensation cascode amplification circuitry 404, and the compensation-current source circuitry 402. FIG. 7 depicts an example current relationship relative to the cascode node 310. FIGS. 8-1 and 8-2 are referenced to describe example operations of the controller 408. Further, example implementations of the phase shift circuitry 406 are described with reference to FIGS. 9-1 and 9-2.

Figure 5:
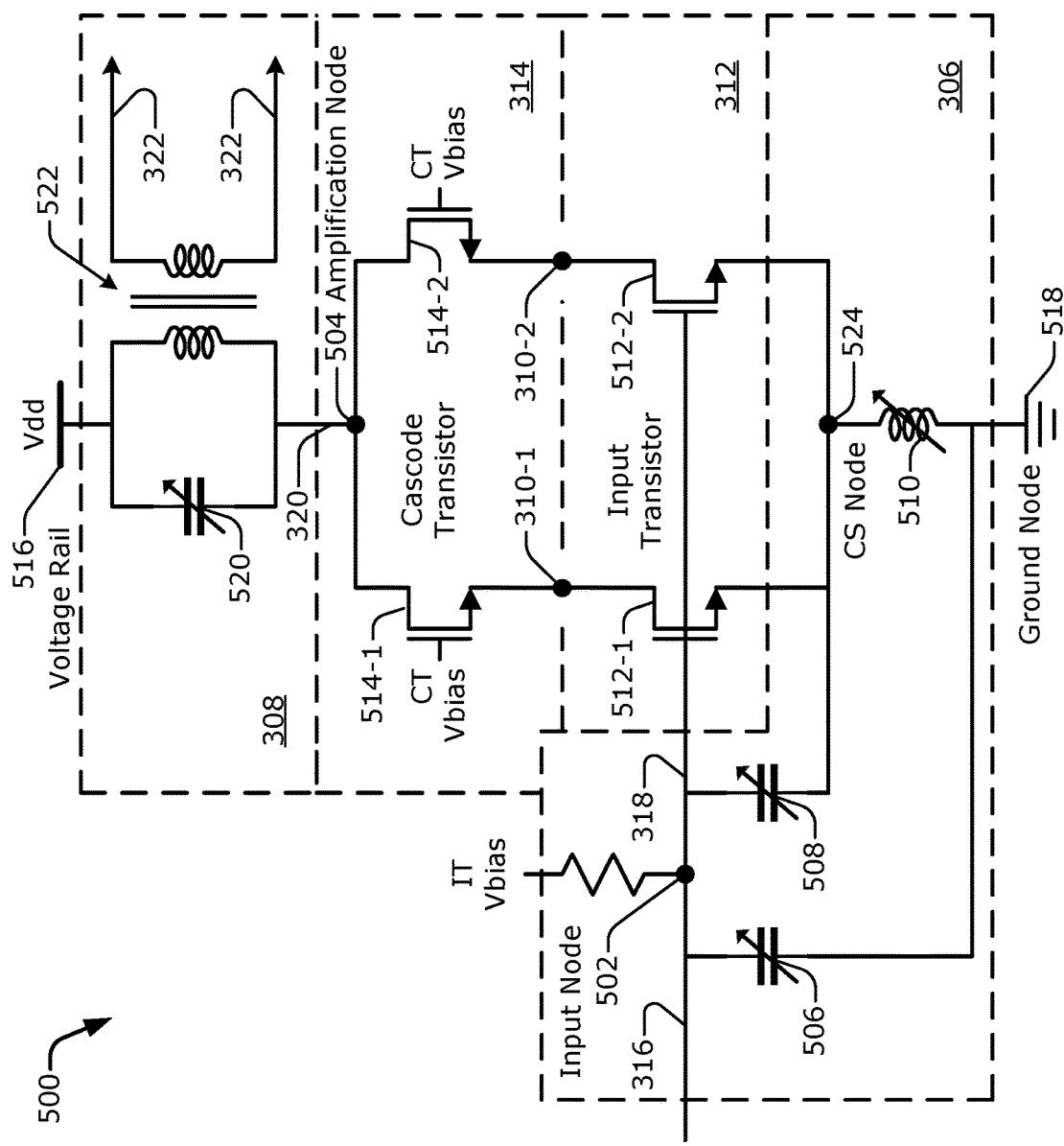
FIG. 5 is a circuit diagram illustrating examples of input amplification circuitry and cascode amplification circuitry.

FIG. 5 is a circuit diagram 500 illustrating examples of circuit-level components for the input circuit 306, the input amplification circuitry 312, the cascode amplification circuitry 314, and the output circuit 308. The circuit diagram 500 includes a voltage rail 516 (Vdd) and a ground node 518. The input circuit 306 includes an input node 502, a common-source node 524 (CS Node 524), an adjustable shunt capacitor 506, an adjustable gate-source coupling capacitor 508, and an adjustable degeneration inductor 510. The output circuit 308 includes an adjustable output capacitor 520 and a transformer 522.

In example implementations, the input amplification circuitry 312 and the cascode amplification circuitry 314 each include two transistors to build two respective vertical cascode amplification branches. The input amplification circuitry 312 includes at least one input transistor 512. As shown, the input amplification circuitry 312 includes a first input transistor 512-1 and a second input transistor 512-2. The cascode amplification circuitry 314 includes an amplification node 504 and at least one cascode transistor 514. As illustrated, the cascode amplification circuitry 314 includes a first cascode transistor 514-1 and a second cascode transistor 514-2. A first cascode amplification branch includes the first input transistor 512-1 and the first cascode transistor 514-1. A second cascode amplification branch includes the second input transistor 512-2 and the second cascode transistor 514-2. However, the input amplification circuitry 312 and the cascode amplification circuitry 314 can be built with one cascode amplification branch and one transistor apiece or more than two such branches and more than two transistors apiece.

With regard to the input circuit 306, the adjustable shunt capacitor 506 is coupled between the input node 502 and the ground node 518, and the adjustable gate-source coupling capacitor 508 is coupled between the input node 502 and the common-source node 524. The adjustable degeneration inductor 510 is coupled between the common-source node 524 and the ground node 518. The respective capacitive and inductive values of these components can be adjusted to match an impedance of a component coupled to the input of the amplifier 128 and in accordance with a frequency range of operation intended for the amplifier 128.

With regard to the input amplification circuitry 312, the first input transistor 512-1 is connected between a first cascode node 310-1 and the common-source node 524. Similarly, the second input transistor 512-2 is connected between a second cascode node 310-2 and the common-source node 524. With regard to the cascode amplification circuitry 314, the first cascode transistor 514-1 is connected between the first cascode node 310-1 and the amplification node 504. Similarly, the second cascode transistor 514-2 is connected between the second cascode node 310-2 and the amplification node 504. As used herein, the term "connect" or "connected" refers to an electrical connection, including a direct connection (e.g., connecting discrete circuit components via a same node) or an indirect connection (e.g., connecting discrete circuit components via one or more other devices or other discrete circuit elements).

With regard to the output circuit 308, the adjustable output capacitor 520 is coupled in parallel with a primary side of the transformer 522 between the amplification node 504 and the voltage rail 516. The components of the output circuit 308 can provide impedance-matching with a component that is adjacent to the amplifier 128 and can have values set in accordance with an operational frequency range of interest. Further, the transformer 522 can provide physical separation between the amplifier 128 and the adjacent component and can also convert the amplified signal 320 from being signal ended to a differential outgoing signal 322 at a secondary side of the transformer 522. Although particular components and interconnections are described with regard to the input circuit 306 and the output circuit 308, the amplifier 128 can be constructed in alternative manners, such as with more, fewer, or different components.

In some implementations, each of the illustrated transistors is realized with a field effect transformer (FET). Thus, each transistor can include a gate terminal, a source terminal, and a drain terminal. To operate in a desired range, each transistor is biased with an appropriate bias voltage at a respective gate terminal thereof. An input transistor bias voltage (IT Vbias) is coupled to the gate terminals of the first input transistor 512-1 and the second input transistor 512-2. A cascode transistor bias voltage (CT Vbias) is coupled to the gate terminals of the first cascode transistor 514-1 and the second cascode transistor 514-2. A bias voltage (Vbias) may be coupled to a gate terminal of a given transistor via a resistor, which is shown for the input transistor bias voltage (IT Vbias) at the input node 502. As is depicted, both of the transistors in each cascode amplification branch may be implemented using, for example, an n-type metal-oxide-semiconductor (NMOS) field effect transistor (FET) (NFET).

Figure 6:
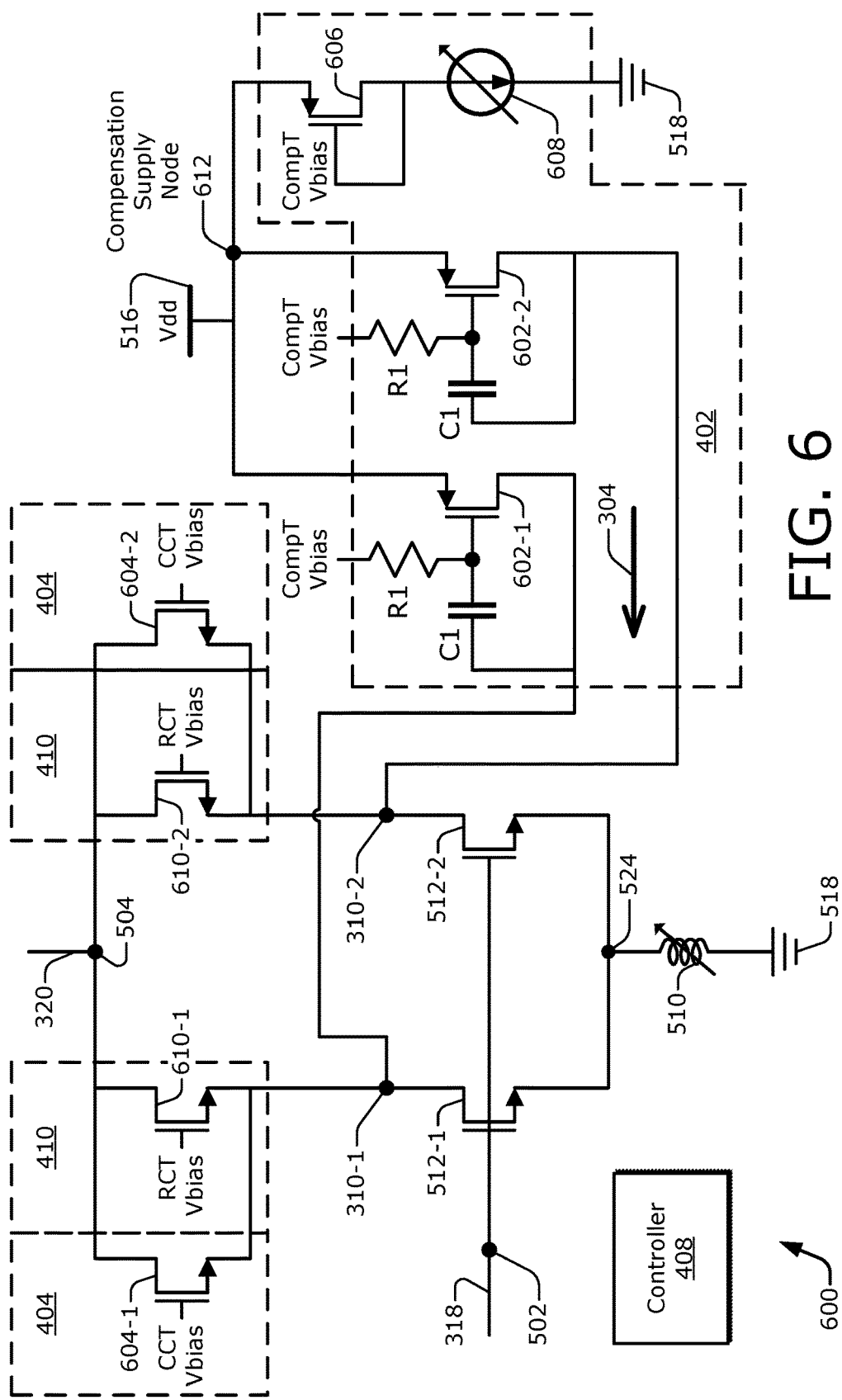
FIG. 6 is a circuit diagram illustrating example implementations of compensation-current source circuitry and both regular cascode amplification circuitry and compensation cascode amplification circuitry.

FIG. 6 is a circuit diagram 600 illustrating example implementations of regular cascode amplification circuitry 410, compensation cascode amplification circuitry 404, and compensation-current source circuitry 402. As is indicated by FIG. 4, the cascode amplification circuitry 314 can include the regular cascode amplification circuitry 410 or the compensation cascode amplification circuitry 404 (or both). As depicted in FIG. 6, the illustrated example amplifier includes both circuitries. This enables the amplifier 128 to switch between a regular mode that does not utilize described compensation functionality and a compensation mode that does utilize the described compensation functionality.

The regular cascode amplification circuitry 410 includes at least one regular cascode transistor 610. As shown, the regular cascode amplification circuitry 410 includes a first regular cascode transistor 610-1 and a second regular cascode transistor 610-2. The compensation cascode amplification circuitry 404 includes at least one compensation cascode transistor 604. As shown, the compensation cascode amplification circuitry 404 includes a first compensation cascode transistor 604-1 and a second compensation cascode transistor 604-2. The first compensation cascode transistor 604-1 and the first regular cascode transistor 610-1 are coupled between the amplification node 504 and the first cascode node 310-1. The second compensation cascode transistor 604-2 and the second regular cascode transistor 610-2 are coupled between the amplification node 504 and the second cascode node 310-2. The first regular cascode transistor 610-1 and the second regular cascode transistor 610-2 are biased with a regular cascode transistor bias voltage (RCT Vbias). The first compensation cascode transistor 604-1 and the second compensation cascode transistor 604-2 are biased with a compensation cascode transistor bias voltage (CCT Vbias).

In operation generally, the regular cascode transistors 610-1 and 610-2 are employed in the regular mode that does not utilize the described compensation functionality. To engage the compensation mode, the controller 408 disables the regular cascode transistors 610-1 and 610-2. The controller 408 also enables the compensation cascode transistors 604-1 and 604-2. In some implementations, a compensation cascode transistor 604 is smaller than a regular cascode transistor 610. For example, each compensation cascode transistor 604 can be smaller than half a size of each regular cascode transistor 610. More specifically, each respective compensation cascode transistor 604 can be built on a 3× scale relative to each respective regular cascode transistor 610 being built on a 13× scale. For instance, a ratio of sizes between the compensation cascode transistor 604 and the regular cascode transistor 610 can be 3:13. In such an implementation, regardless of a number of physical transistors used to realize one or more compensation cascode transistors 604 or one or more regular cascode transistors 610, a ratio of the total width of the former to the total width of the latter can be 3-to-13. By switching to smaller transistors for the compensation mode, the amplifier can generate larger voltage swings at the cascode node 310. The larger voltage swings enable a larger current to be compensated by the compensation transistors of the compensation-current source circuitry 402. To engage the compensation mode, the controller 408 also activates the compensation-current source circuitry 402. Example approaches to controlling the transistors of the amplifier 128 are described below with reference to FIGS. 8-1 and 8-2.

Figures 1, 9:
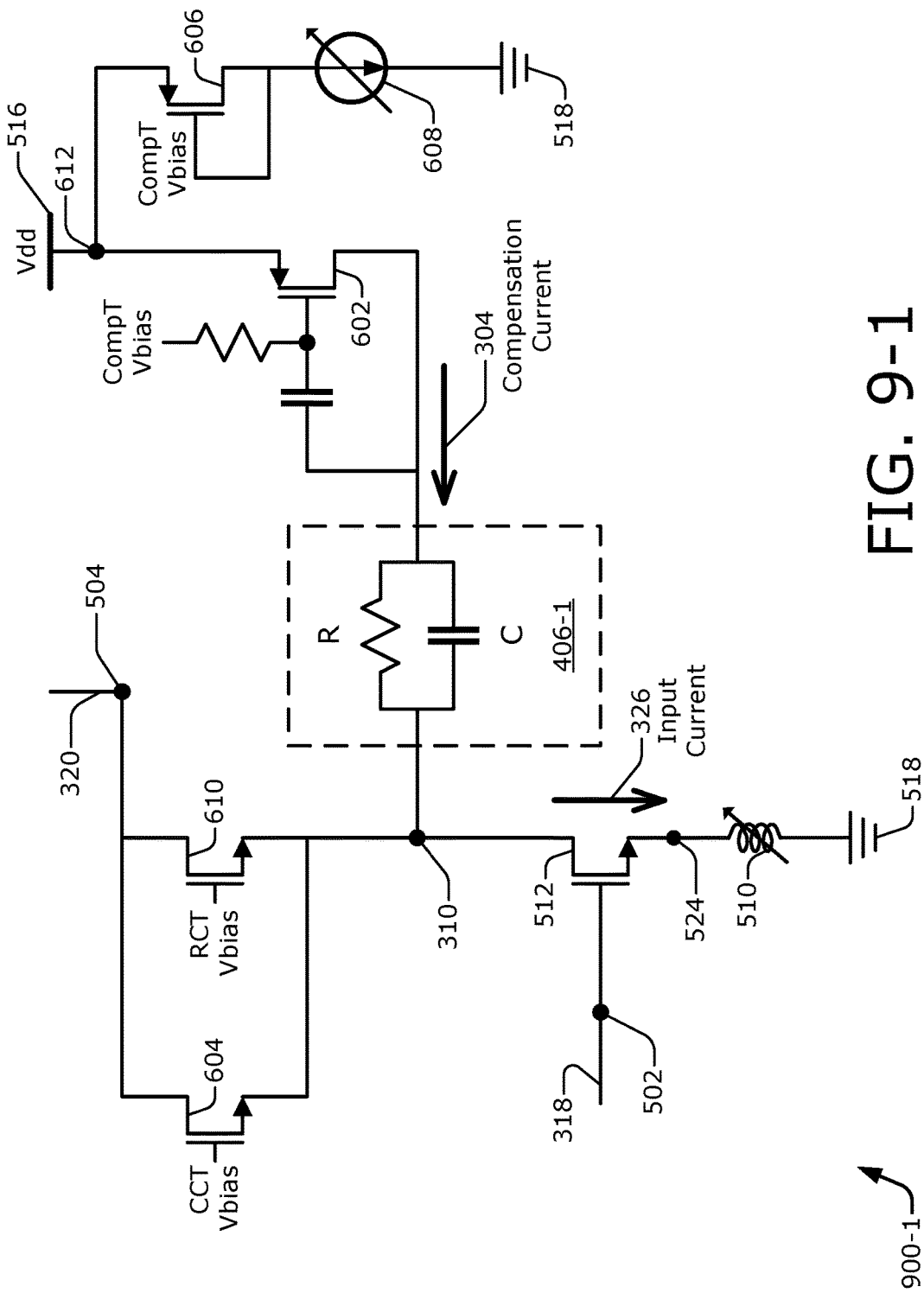
Figures 2, 9:
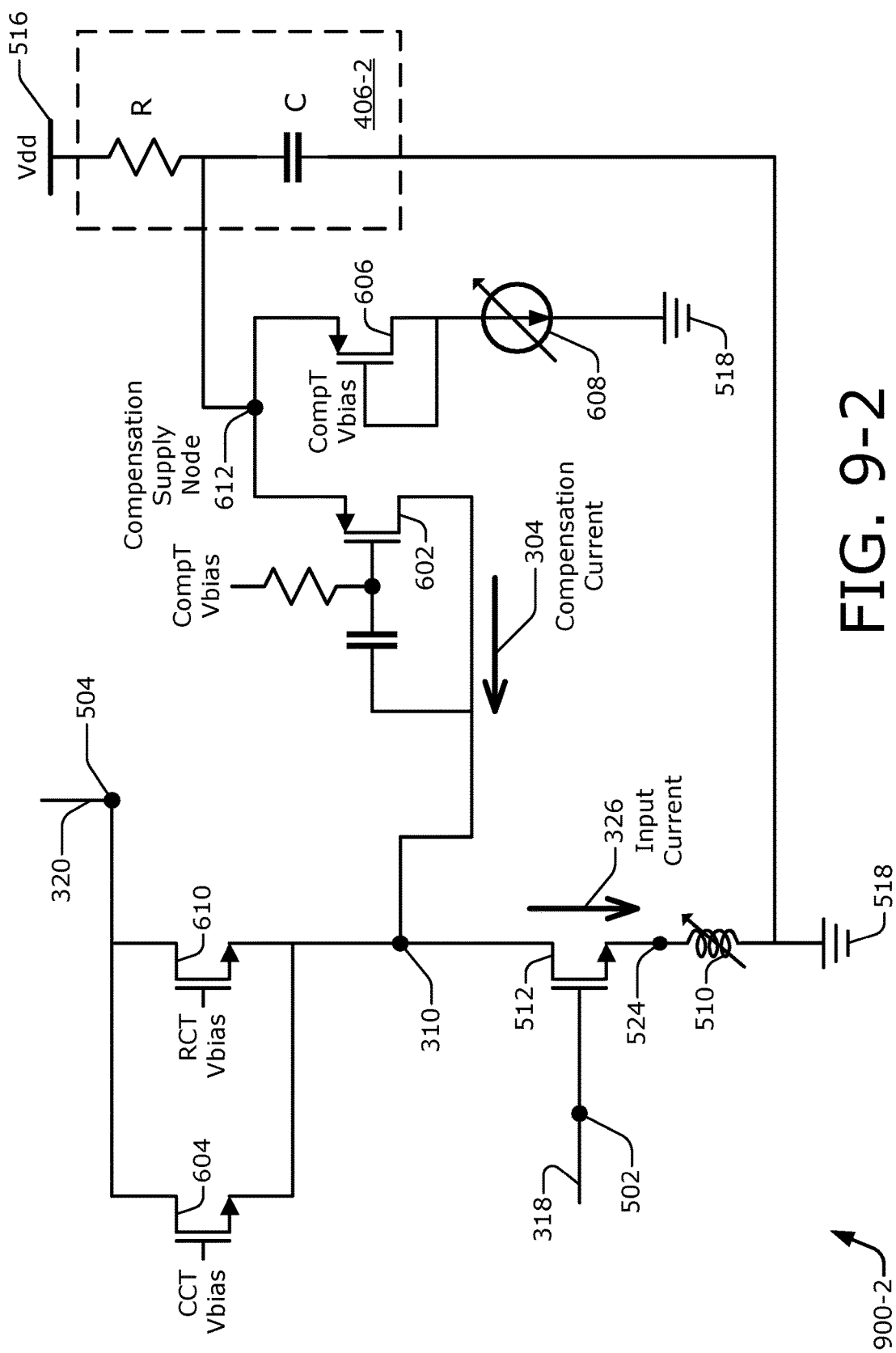

In FIG. 6, the compensation-current source circuitry 402 includes at least one compensation transistor 602. As shown, the compensation-current source circuitry 402 includes a first compensation transistor 602-1, a second compensation transistor 602-2, a bias transistor 606, and an adjustable current source 608. The bias transistor 606 and the adjustable current source 608 jointly bias the compensation transistors 602-1 and 602-2. Each compensation transistor 602 is coupled between a compensation supply node 612 and a respective cascode node 310. In FIG. 6, the compensation supply node 612 corresponds to, and is co-located with, the voltage rail 516; however, the compensation supply node 612 may be separated from the voltage rail 516 by one or more components (e.g., as shown in FIG. 9-2).

Individually, the first compensation transistor 602-1 is coupled between the compensation supply node 612 and the first cascode node 310-1, and the second compensation transistor 602-2 is coupled between the compensation supply node 612 and the second cascode node 310-2. Each compensation transistor 602 is biased with a compensation transistor bias voltage (CompT Vbias). The compensation transistor bias voltage (CompT Vbias) is coupled to each respective gate terminal of each respective compensation transistor 602. The compensation transistor bias voltage (CompT Vbias) may be applied to the compensation transistor 602 using one or more components. As shown, the compensation transistor bias voltage (CompT Vbias) is coupled to each gate terminal via a respective resistor R1.

The compensation transistor bias voltage (CompT Vbias) is generated by the bias transistor 606 responsive to the adjustable current source 608. The bias transistor 606 generates the compensation transistor bias voltage (CompT Vbias) at a gate terminal thereof. The bias transistor 606 is coupled to the compensation supply node 612. The bias transistor 606 is also coupled in series with the adjustable current source 608 between the compensation supply node 612 and the ground node 518. The bias transistor 606 is configured in a diode-connected configuration. Thus, for this metal-oxide-semiconductor FET (MOSFET), a gate terminal and a drain terminal of the diode-connected transistor are coupled to each other as shown.

If the adjustable current source 608 is turned on, current flows through the bias transistor 606, and the compensation transistor bias voltage (CompT Vbias) has a low value, which can be relatively close to that of the ground node 518. More specifically, the controller 408 can turn on the adjustable current source 608 to a degree that causes the compensation transistor bias voltage (CompT Vbias) to properly bias the compensation transistor 602 to permit current the compensation current 304 to flow. On the other hand, if the adjustable current source 608 is turned off, current does not flow through the bias transistor 606, and the compensation transistor bias voltage (CompT Vbias) has a high value, which can be relatively close to that of the voltage rail 516 (e.g., a supply voltage Vdd). More specifically, the controller 408 can turn the adjustable current source 608 on or off to a degree that causes the compensation transistor bias voltage (CompT Vbias) to bias the compensation transistor 602 such that compensation current 304 is blocked from flowing, at least to an appreciable degree. The controller 408 can control an on/off state of the adjustable current source 608, or an amount by which current flows through the bias transistor 606, as is described below with reference to FIGS. 8-1 and 8-2.

In some implementations, each compensation transistor 602 is configured in a diode-connected configuration. Thus, a gate terminal and a drain terminal of each compensation transistor 602 are coupled to each other. The gate terminal can be coupled to the drain terminal via one or more components, such as the capacitor C1 as shown. The capacitor C1 isolates the gate terminal of the compensation transistor bias voltage (CompT Vbias) from other circuitry components from a direct-current (DC) perspective. The gate terminal of the compensation transistor 602 is therefore connected to the cascode node 310 from an alternating-current (AC) perspective but disconnected from the DC perspective. In the diode-connected configuration, the compensation transistor 602 exhibits a quadratic or parabolic response. This second-order response can be used to counteract the second-order harmonic distortion produced by the input transistor 512 using the compensation current 304. As is depicted, the compensation transistors 602-1 and 602-2 in the compensation-current source circuitry 402 may be implemented using, for example, a p-type metal-oxide-semiconductor (PMOS) FET (PFET). The respective source terminal of each respective compensation transistor 602 is coupled to the compensation supply node 612 and the voltage rail 516.

In operation, for a regular mode, if the adjustable current source 608 is turned off, the compensation transistor bias voltage (CompT Vbias) goes relatively high at the bias transistor 606. This high compensation transistor bias voltage (CompT Vbias) is coupled to the gate terminals of the first and second compensation transistors 602-1 and 602-2, which turns off or disables these PFET transistors. Consequently, no compensation current 304 flows. On the other hand, for a compensation mode, if the adjustable current source 608 is turned on, the compensation transistor bias voltage (CompT Vbias) goes relatively low at the bias transistor 606. This low compensation transistor bias voltage (CompT Vbias) is coupled to the gate terminals of the first and second compensation transistors 602-1 and 602-2, which biases these transistors. Consequently, the compensation current 304 flows through each respective first and second compensation transistor 602-1 and 602-2 with regard to the respective first and second cascode node 310-1 and 310-2. Relevant current flows are described further with reference to FIG. 7.

FIG. 7 illustrates, at 700, example current flows with respect to the cascode node 310, including the compensation current 304 that can be used to implement amplification with post-distortion compensation. For clarity, one cascode node 310 and one set of transistors is shown. The set of transistors includes the input transistor 512, the compensation cascode transistor 604, and the compensation transistor 602. Each respective transistor has a corresponding transconductance value and associated current flowing through the transistor. The compensation transistor 602 has a corresponding transconductance value 704 and the associated compensation current 304. The compensation cascode transistor 604 has a corresponding transconductance value 706 and the associated cascode current 324. The input transistor 512 has a corresponding transconductance value 708 and the associated input current 326. The input current 326 results from the transconductance amplification of the input voltage 712 that is applied to the input node 502 by the input signal 318. The transconductance amplification of the input transistor 512 converts the input voltage 712 to the input current 326. Thus, the input current 326 that flows through a channel (e.g., from drain to source) of the input transistor 512 is based on the input voltage 712.

The cascode current 324 includes a first-order component (not explicitly shown) and a second-order component, which is called a second-order cascode current 702 herein. The input current 326 includes a first-order component (not explicitly shown) and a second-order component, which is called a second-order input current 714 herein. A voltage at the cascode node 310 is referred to as a cascode voltage 710, and a voltage at the gate terminal of the input transistor 512 is referred to as an input voltage 712.

The three currents combine (e.g., sum) at the cascode node 310. For example, by combining the input current 326 and the compensation current 304 at the cascode node 310, the cascode current 324 is produced. The three currents can be related in accordance with the following three equations:

$$i_{casc} = i_{input} + i_{comp} \qquad (1);$$

$$i_{input} = gm_{1\_input} \times vin + gm_{2\_input} \times vin^2 + gm_{3\_input} \times vin^3 \qquad (2); \text{ and}$$

$$i_{comp} = gm_{1\_comp} \times vcasc + gm_{2\_comp} \times vcasc^2 + gm_{3\_input} \times vcasc^3 \qquad (3),$$

wherein "$i_{casc}$" corresponds to the cascode current 324, "$i_{input}$" corresponds to the input current 326, and "$i_{comp}$" corresponds to the compensation current 304. This current-oriented equation (1) is a general nodal-based current equation before application of current direction or sign to account for other physical properties of the circuitry. Additionally, "vin" corresponds to the input voltage 712, and "vcasc" corresponds to the cascode voltage 710. The "$gm_{x\_input}$" corresponds to the transconductance value 708 of the input transistor 512, and the "$gm_{x\_comp}$" corresponds to the transconductance value 704 of the compensation transistor 602. Further, the index "x" on each "$gm_x$" transconductance variable and the exponent "x" on each "$v^x$" voltage variable corresponds to an order of the variable—e.g., first order, second order, or third order.

For simplicity, the cascode voltage 710 can be approximated as follows:

$$vcasc = -i_{casc} \times \left(\frac{1}{gm\_casc}\right), \quad (4)$$

wherein "$gm\_casc$" corresponds to the transconductance value 706 of the compensation cascode transistor 604. After considering the example physical implementation depicted in FIG. 7, it is apparent that the compensation current $i_{comp}$ can flow in a different direction as compared to the direction indicated by the general equation (1). Instead, the compensation current $i_{comp}$ can reduce a magnitude of the cascode current $i_{casc}$ by flowing into the cascode node 310 (e.g., the compensation current $i_{comp}$ can be negative with respect to equation (1)). Thus, a more specific way to reflect the current relationship depicted in FIG. 7 is given by: $i_{input} = i_{casc} + i_{comp}$. In this manner, the compensation current $i_{comp}$ can be injected into the cascode node 310 to counteract the undesirable second-order current that develops in the input current $i_{input}$ so that the cascode current $i_{casc}$ can does not have to provide this additional second order current, which would enable second-order harmonic distortion to reach the amplified signal 320.

Based on equations (1)-(4) above, the first-order current component of the cascode current 324 can be derived as follows:

$$i_{1\_casc} = \left(\frac{gm_{1\_casc}}{gm_{1\_casc} + gm_{1\_comp}}\right) \times (gm_{1\_input}) \times vin, \quad (5)$$

wherein "$gm_{1\_casc}$" corresponds to the transconductance value 706 of the compensation cascode transistor 604 for the first order response. Similarly, also based on equations (1)-(4) above, the second-order current component of the cascode current 324 can be derived as follows:

$$i_{2\_casc} = \left(gm_{2\_input} - gm_{2\_comp} \times \left(\frac{gm_{1\_input}}{gm_{1\_casc} + gm_{1\_comp}}\right)^2\right) \times vin^2, \quad (6)$$

wherein "$i_{2\_casc}$" corresponds to the second-order cascode current 702 of the cascode current 324.

Due to the nature of an NMOS FET versus a PMOS FET, the "$gm_{2\_comp}$" of the PFET compensation transistor 602 has a different polarity than the "$gm_{2\_input}$" of the NFET input transistor 512. Thus, as indicated by Equation (6), the second-order component "$gm_{2\_input}$" of the NFET input transistor 512 can be substantially canceled by adjusting the "$gm_{2\_comp}$" of the PFET compensation transistor 602. Generally, any one or more of the transconductance values can be adjusted at least during a design phase to substantially prevent the second-order cascode current 702 from reaching an appreciable level by canceling the second-order input current 714 at the cascode node 310. The cancellation may be accomplished to a level governed by the capabilities of a given process technology and across different voltages and temperatures of operation.

By manipulating the transconductance values, or at least the transconductance value 704 of the compensation transistor 602, a magnitude of the compensation current 304 can be sourced to be approximately equal to a magnitude of the second-order input current 714 of the input current 326. Thus, the resulting second-order cascode current 702 of the cascode current 324 is produced at a substantially lower, if not insignificant, level. More specifically, the magnitude of the compensation current 304 can be configured to be approximately equal to the magnitude of the second-order input current 714 of the input current 326 based on the transconductance value 704 of the compensation transistor 602 of the compensation circuitry 202, the transconductance value 706 of the cascode transistor 514 (e.g., the compensation cascode transistor 604 here) of the cascode amplification circuitry 314, or the transconductance value 708 of the input transistor 512 of the input amplification circuitry 312.

Further, a phase of the compensation current 304 can be configured to be approximately opposite a phase of the second-order input current 714 of the input current 326 to the point that a negligible amount of the second-order cascode current 702 of the cascode current 324 exists. For example, the phase of the compensation current 304 can be configured to be approximately opposite the phase of the second-order input current 714 based on a doping polarity (e.g., for a PFET implementation) of a compensation transistor 602 of the compensation circuitry 202 being complementary to a doping polarity (e.g., for an NFET implementation) of an input transistor 512 of the input amplification circuitry 312. Additionally, the phase can be adjusted by phase shift circuitry 406 (of FIGS. 4, 9-1, and 9-2).

When the compensation circuitry 202 is engaged to activate the compensation feature of the amplifier 128, several performance characteristics of the amplifier 128 can change. First, some signal-related current is cancelled by the compensation current 304. This can result in a slightly degraded noise figure (e.g., by less than 0.5 dB). Second, the current draw is increased for the amplifier 128 (e.g., by a few milliamps). However, rejection of the second-harmonic distortion (HD2) is increased. For example, the second-harmonic distortion rejection can be increased by approximately 10-12 dB in band B8 and can be increased by approximately 7 dB in band B12.

FIGS. 8-1 and 8-2 illustrate example operations of a controller 408 of an amplifier 128 that includes compensation circuitry 202 for amplification with post-distortion compensation. At 800-1 of FIG. 8-1, the compensation circuitry 202 (e.g., as depicted in FIG. 4) includes the compensation cascode transistor 604, the compensation transistor 602, and a bias circuit 808. As shown, the bias circuit 808 includes the bias transistor 606 and the adjustable current source 608. For clarity, one cascode amplification branch and one corresponding compensation branch is depicted in FIG. 8-1. However, the principles are applicable to amplifiers with multiple cascode amplification and compensation branch combinations.

As shown, the controller 408 receives a control parameter indicator signal 802 and provides two control signals: a cascode amplification control signal 804 and a compensation-current source control signal 806. In operation, the controller 408 generates the cascode amplification control signal 804 and the compensation-current source control signal 806 based on the control parameter indicator signal 802. The control parameter indicator signal 802 is indicative of a control parameter, which may be provided by, e.g., a modem or a higher layer of logic. Control parameters include, for example, environmental conditions, a wireless standard that is being used, a current network operator, a frequency range over which a signal is being transmitted or received, a signaling band, and so forth. For instance, the control parameter indicator signal 802 can indicate a current or expected band of operation, such as Band 8 or Band 12, which are relatively lower-frequency bands.

The controller 408 is configured to engage or disengage a mode providing compensation functionality based on the control parameter indicator signal 802. For example, if an indicated band of operation corresponds to a band for which compensation is to be engaged, the controller 408 drives the two control signals accordingly. To engage the compensation functionality, the controller 408 activates the compensation cascode amplification circuitry 404 using the cascode amplification control signal 804 and activates the compensation-current source circuitry 402 (e.g., of FIG. 6) via the bias circuit 808 using the compensation-current source control signal 806. An example of this control scheme is described with reference to FIG. 8-2.

At 800-2 of FIG. 8-2, the controller 408 issues the compensation-current source control signal 806 to activate the compensation transistor 602 as shown in FIG. 8-1. To do so, the compensation-current source control signal 806 turns on the adjustable current source 608 to cause current to flow through the bias transistor 606. This enables the bias circuit 808 to bias the compensation transistor 602 into an on state or an off state, as is described above with reference to FIG. 6. The controller 408 issues the cascode amplification control signal 804 to activate the compensation cascode amplification circuitry 404 and deactivate the regular cascode amplification circuitry 410 as shown in FIG. 8-1. The cascode amplification control signal 804 functions as a cascode transistor selection signal. Thus, the controller 408 enables the compensation cascode transistor 604 and disables the regular cascode transistor 610, or vice versa depending on the mode of operation.

The illustrated mode corresponds to an active compensation functionality. To engage this mode, the cascode amplification control signal 804 sets respective switches to provide respective bias voltages to the compensation cascode transistor 604 and the regular cascode transistor 610. On the left, a switch 814 is set to connect the compensation cascode transistor bias voltage (CCT Vbias) to a relatively high voltage 812 (HighV) (e.g., at or near a supply voltage Vdd) to turn on the NFET compensation cascode transistor 604. On the right, a switch 816 is set to connect the regular cascode transistor bias voltage (RCT Vbias) to a relatively low voltage 810 (LowV) (e.g., at or near a ground voltage) to turn off the NFET regular cascode transistor 610.

If, for example, a current band of operation is not relevant to compensation functionality, the mode may be changed. To engage a mode that does not activate the compensation functionality, the controller 408 turns off the adjustable current source 608 using the compensation-current source control signal 806 and swaps the illustrated positions of the switches 814 and 816 using the cascode amplification control signal 804. This disables the compensation cascode transistor 604 and enables the regular cascode transistor 610. Further, with the current of the adjustable current source 608 turned off, the compensation transistor bias voltage (CompT Vbias) goes high and turns off the one or more compensation transistors 602, and thus the compensation current 304 is likewise turned off.

FIGS. 9-1 and 9-2 illustrate example implementations 900-1 and 900-2, respectively, of phase shift circuitry 406 of compensation circuitry 202 for amplification with post-distortion compensation. Each example of the phase shift circuitry 406 includes a resistive-capacitive network, such as an RC filter, with at least one resistor R and at least one capacitor C. The values of a resistance of the resistor R and a capacitance of the capacitor C can be selected to target a frequency that is to be filtered (e.g., by being passed or rejected). For example, a product of the two values (R*C) can be approximately equal to the frequency of a targeted FLO/2 jammer. Although the phase shift circuitry 406 is implemented as at least one RC filter in FIGS. 9-1 and 9-2, the phase shift circuitry 406 can alternatively be implemented with a different type of filter, with different components, with more or fewer components, and so forth.

As indicated in FIG. 4, the phase shift circuitry 406 is coupled to the compensation-current source circuitry 402 and the input amplification circuitry 312. Two example implementations of this are described below, one for FIG. 9-1 and another for FIG. 9-2. At an implementation 900-1 of FIG. 9-1, the phase shift circuitry 406-1 is coupled between at least one terminal (e.g., the drain terminal) of the compensation transistor 602 and the cascode node 310. The phase shift circuitry 406-1 can include, for instance, a resistive-capacitive filter (RC filter). As shown for this case, a resistor R and a capacitor C are coupled together in parallel between two common nodes, which are two nodes that are common to both components.

At an implementation 900-2 of FIG. 9-2, the phase shift circuitry 406-2 is coupled between the voltage rail 516 and the source terminal side of the input transistor 512 (e.g., via the adjustable degeneration inductor 510 at the ground node 518). The phase shift circuitry 406-2 can include, for instance, an RC filter. As shown for this case, a resistor R and a capacitor C are coupled together in series. Between the resistor R and the capacitor C is a common node that corresponds to the compensation supply node 612. Thus, the resistor R is coupled between the voltage rail 516 and the compensation supply node 612, and the capacitor C is coupled between the compensation supply node 612 and the ground node 518.

This creates a lowpass filter through the compensation transistor 602. A deleterious inductance in the power supply, such as in the voltage rail 516, can be ameliorated using the RC filter. A value of a resistance of the resistor R can be selected to be relatively low so that the supply voltage Vdd does not drop too much at the compensation supply node 612. A value of a capacitance of the capacitor C can then be determined based on a targeted frequency. To align the phases, the RC filter causes a phase of the compensation current 304 through the PFET compensation transistor 602 to be approximately 180 degrees away from a phase of the input current 326 through the NFET input transistor 512.

Figure 10:
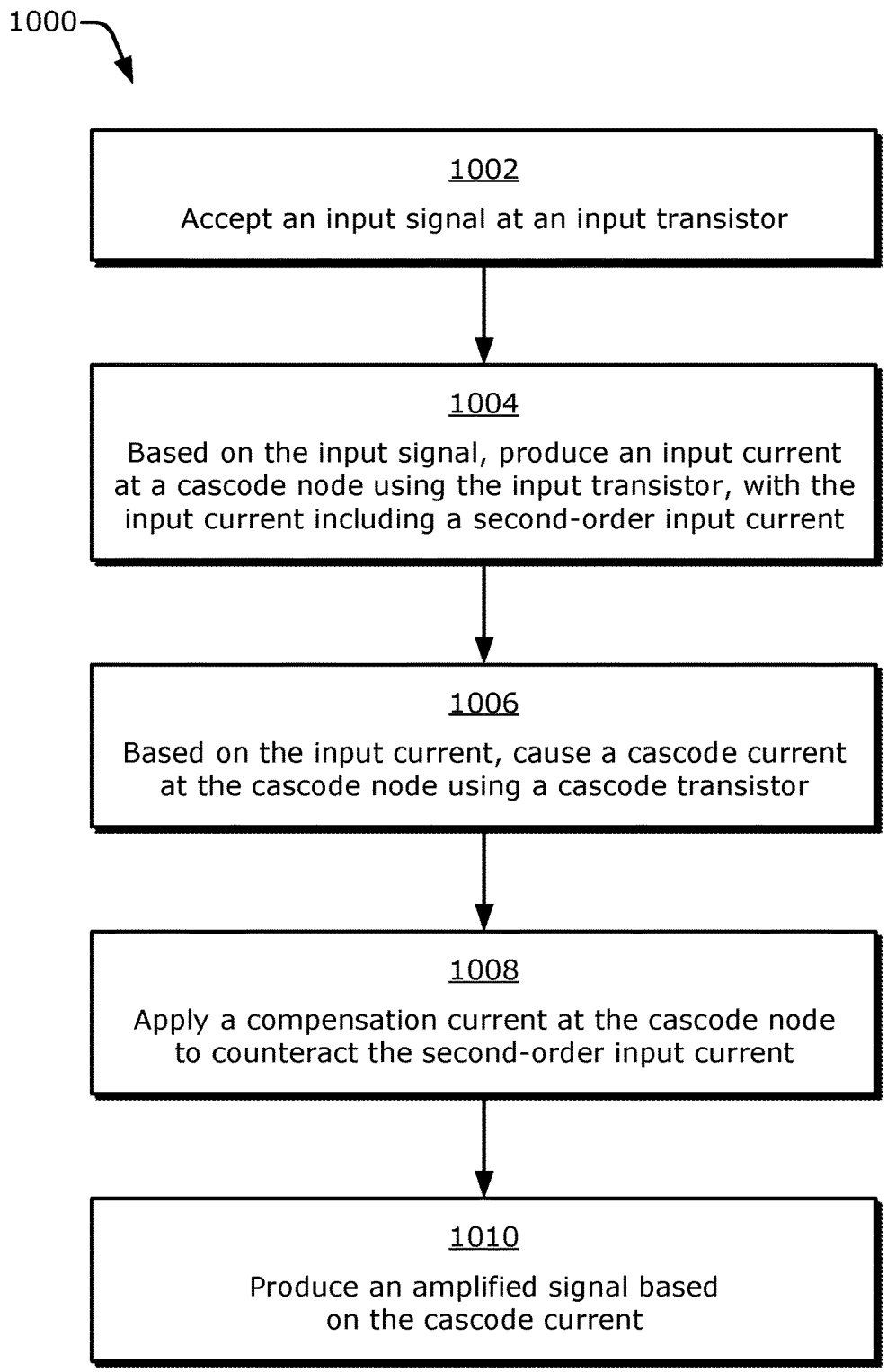
FIG. 10 is a flow diagram illustrating an example process for amplification with post-distortion compensation.

FIG. 10 is a flow diagram illustrating an example process 1000 for amplification with post-distortion compensation. The process 1000 is described in the form of a set of blocks 1002-1010 that specify operations that can be performed. However, operations are not necessarily limited to the order shown in FIG. 10 or described herein, for the operations may be implemented in alternative orders or in fully or partially overlapping manners. Operations represented by the illustrated blocks of the process 1000 may be performed by an amplifier 128, such as at least partially by compensation circuitry 202. More specifically, the operations of the process 1000 may be performed by the input amplification circuitry 312, the cascode amplification circuitry 314, the compensation circuitry 202, as well as one or more transistors thereof.

At block 1002, an input signal is accepted at an input transistor. For example, an input transistor 512 can accept an input signal 318 from an input circuit 306. The input signal 318 can generate an input voltage 712 at a gate terminal of the input transistor 512.

At block 1004, based on the input signal, an input current is produced at a cascode node using the input transistor, with the input current including a second-order input current. For example, the input transistor 512 can produce an input current 326 at a cascode node 310 based on the input signal 318, with the input current 326 including a second-order input current 714. Changes to the input voltage 712 that result from changes to the input signal 318 cause changes to the input current 326 that flows through the input transistor 512 from the cascode node 310 to the ground node 518. However, the input transistor 512 can create second-order harmonic distortion with the second-order input current 714 due to the second-order transconductance value "$gm_{2\_input}$" of the transconductance value 708 of the input transistor 512.

At block 1006, based on the input current, a cascode current is caused to flow at the cascode node using a cascode transistor. For example, a cascode transistor 514 can cause a cascode current 324 to flow at the cascode node 310 based on the input current 326, with the cascode current 324 including a second-order cascode current 702. In operation, the input current 326 is pulled from the cascode node 310 such that the cascode current 324 flowing through the cascode transistor 514 is based on the input current 326. Consequently, harmonics, including second-order harmonics, that are present in the input current 326 can be reflected in the cascode current 324, and thus in the amplified signal 320, absent post-distortion compensation.

In some implementations, the cascode transistor 514 can be switched between two or more different cascode transistors depending on a mode of operation. For example, if a compensation mode is not engaged, the cascode transistor 514 comprises a regular cascode transistor 610. If, on the other hand, the compensation mode is engaged, the cascode transistor 514 comprises a compensation cascode transistor 604.

At block 1008, a compensation current is applied at the cascode node to counteract the second-order input current. For example, compensation circuitry 202 can apply a compensation current 304 at the cascode node 310 to counteract the second-order input current 714. For instance, a compensation transistor 602 can inject the compensation current 304 into the cascode node 310, with the compensation current 304 having a substantially equal magnitude (and opposite phase) to the second-order input current 714. Consequently, the remainder of the second-order input current 714 that is manifested as the second-order cascode current 702 is significantly reduced, including to a relatively negligible level in accordance with the equations set forth above.

At block 1010, an amplified signal is produced based on the cascode current. For example, the cascode transistor 514 can produce an amplified signal 320 based on the cascode current 324. As the cascode current 324 fluctuates responsive to changes in the input current 326 and responsive to at least partial cancellation of the second-order input current 714 by the compensation current 304, the amplified signal 320 that is provided to an output circuit 308 changes to provide a signal for components that are downstream of the amplifier 128, with the second harmonic distortion appreciably reduced.

Figure 11:
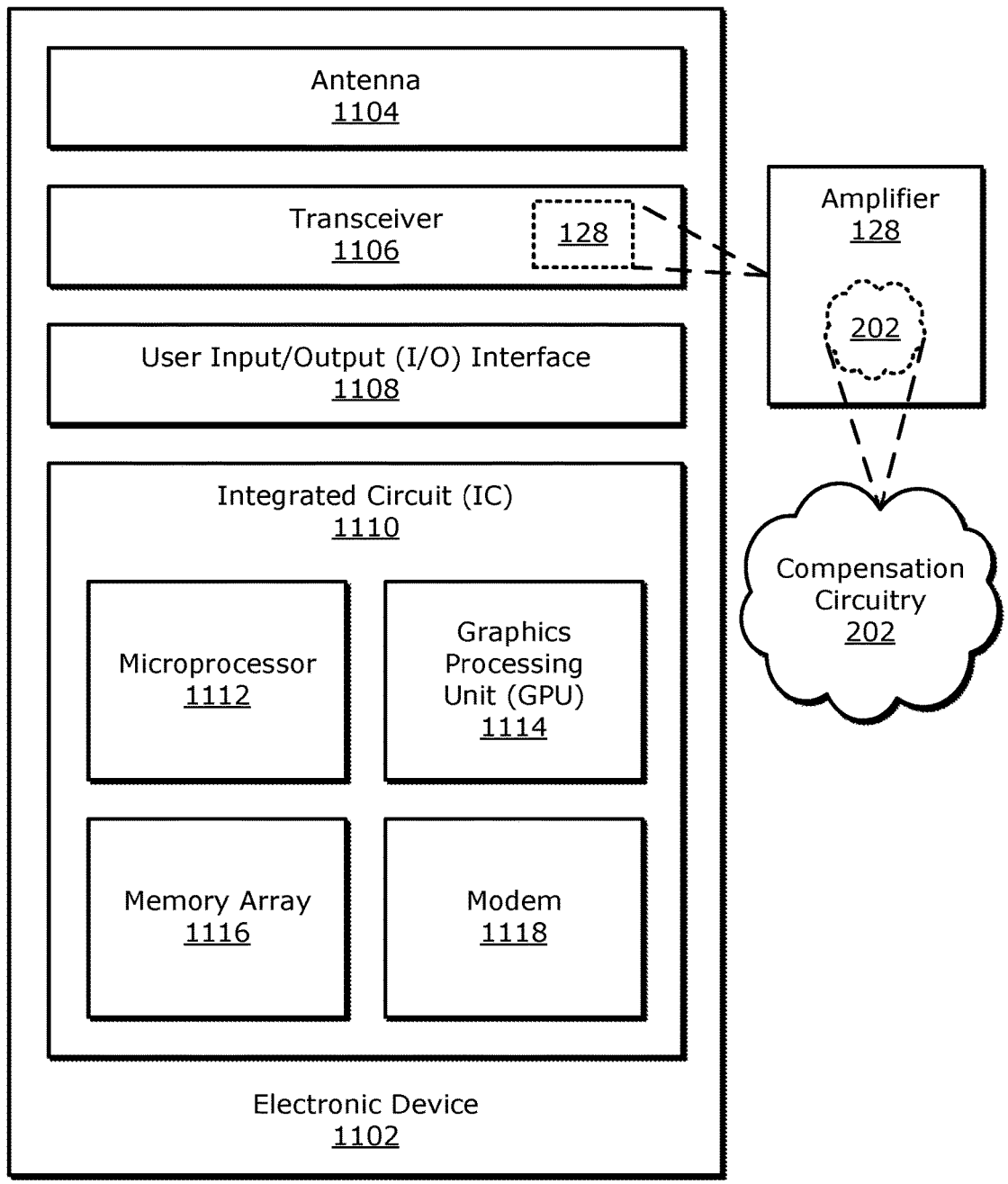
FIG. 11 illustrates an example electronic device including an amplifier having associated compensation circuitry with which amplification with post-distortion compensation can be implemented.

FIG. 11 illustrates an example electronic device 1102 including an amplifier 128 having associated compensation circuitry 202 by which amplification with post-distortion compensation can be implemented. As shown, the electronic device 1102 includes an antenna 1104, a transceiver 1106, a user input/output (I/O) interface 1108, and an integrated circuit 1110 (IC). Illustrated examples of the integrated circuit 1110, or cores thereof, include a microprocessor 1112, a graphics processing unit 1114 (GPU), a memory array 1116, and a modem 1118. In one or more example implementations, the transceiver 1106 includes an amplifier 128 that implements compensation circuitry 202 as described herein that can activate or otherwise utilize compensation functionality to ameliorate the effects of second-order harmonic distortion (HD2).

The electronic device 1102 can be a mobile or battery-powered device or a fixed device that is designed to be powered by an electrical grid. Examples of the electronic device 1102 include a server computer, a network switch or router, a blade of a data center, a personal computer, a desktop computer, a notebook or laptop computer, a tablet computer, a smartphone, an entertainment appliance, an Internet of Things (IoT) device, or a wearable electronic device such as a smartwatch, intelligent glasses, or an article of clothing. An electronic device 1102 can also be a device, or a portion thereof, having embedded electronics. Examples of the electronic device 1102 with embedded electronics include a passenger vehicle, industrial equipment, a refrigerator or other home appliance, a drone or other unmanned aerial vehicle (UAV), or a power tool.

For an electronic device with a wireless capability, the electronic device 1102 includes an antenna 1104 that is coupled to a transceiver 1106 to enable reception or transmission of one or more wireless signals. The integrated circuit 1110 may be coupled to the transceiver 1106 to enable the integrated circuit 1110 to have access to received wireless signals or to provide wireless signals for transmission via the antenna 1104. The electronic device 1102 as shown also includes at least one user I/O interface 1108. Examples of the user I/O interface 1108 include a keyboard, a mouse, a microphone, a touch-sensitive screen, a camera, an accelerometer, a haptic mechanism, a speaker, a display screen, or a projector. The transceiver 1106 can correspond to, for example, the wireless transceiver 122 (e.g., of FIGS. 1 and 2) that includes an amplifier 128, such as a low-noise amplifier 128-1 or a power amplifier 128-2.

The integrated circuit 1110 may comprise, for example, one or more instances of a microprocessor 1112, a GPU 1114, a memory array 1116, a modem 1118, and so forth. The microprocessor 1112 may function as a central processing unit (CPU) or other general-purpose processor. Some microprocessors include different parts, such as multiple processing cores, that may be individually powered on or off. The GPU 1114 may be especially adapted to process visual-related data for display, such as video data images. If visual-related data is not being rendered or otherwise processed, the GPU 1114 may be fully or partially powered down. The memory array 1116 stores data for the microprocessor 1112 or the GPU 1114. Example types of memory for the memory array 1116 include random access memory (RAM), such as dynamic RAM (DRAM) or static RAM (SRAM); flash memory; and so forth. If programs are not accessing data stored in memory, the memory array 1116 may be powered down overall or block-by-block. The modem 1118 demodulates a signal to extract encoded information or modulates a signal to encode information into the signal. If there is no information to decode from an inbound communication or to encode for an outbound communication, the modem 1118 may be idled to reduce power consumption. The integrated circuit 1110 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1110 may also comprise a system-on-chip (SoC). An SoC may integrate a sufficient number of different types of components to enable the SoC to provide computational functionality as a notebook computer, a mobile phone, or another electronic apparatus using one chip, at least primarily. Components of an SoC, or an integrated circuit 1110 generally, may be termed cores or circuit blocks. Examples of cores or circuit blocks include, in addition to those that are illustrated in FIG. 11, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for amplification comprising:
a voltage rail; and
a cascode amplifier including:
an amplification node;
a cascode node;
a common-source node;
at least one cascode transistor coupled between the amplification node and the cascode node;
an input transistor coupled between the cascode node and the common-source node; and
a compensation transistor coupled between the voltage rail and the cascode node, the compensation transistor including a gate terminal, a source terminal, and a drain terminal, the compensation transistor comprising a diode-connected transistor in which the gate terminal is coupled to the drain terminal, the gate terminal and the drain terminal being coupled to the cascode node.

2. The apparatus of claim 1, wherein:
the at least one cascode transistor comprises an n-type metal-oxide-semiconductor (NMOS) field effect transistor (FET) (NFET);
the input transistor comprises another NFET; and
the compensation transistor comprises a p-type metal-oxide-semiconductor (PMOS) FET (PFET).

3. The apparatus of claim 1, wherein the at least one cascode transistor comprises:
a compensation cascode transistor coupled between the amplification node and the cascode node; and
a regular cascode transistor coupled between the amplification node and the cascode node.

4. The apparatus of claim 3, further comprising:
a bias circuit coupled to the compensation transistor; and
a controller coupled to the compensation cascode transistor, the regular cascode transistor, and the bias circuit;
the controller configured to:
disable the regular cascode transistor;
enable the compensation cascode transistor; and
cause the bias circuit to enable the compensation transistor.

5. An apparatus for amplification comprising:
an amplifier including:
amplification circuitry configured to produce an amplified signal based on an input signal, the amplification circuitry including:
a cascode node;
input amplification circuitry coupled to the cascode node, the input amplification circuitry configured to accept the input signal and produce an input current at the cascode node based on the input signal; and
cascode amplification circuitry coupled to the cascode node and configured to produce the amplified signal based on a cascode current at the cascode node; and
compensation circuitry coupled to the cascode node, the compensation circuitry configured to produce a compensation current and apply the compensation current to the amplification circuitry via the cascode node to counteract a component of the input current the compensation circuitry including:
compensation-current source circuitry configured to produce the compensation current and apply the compensation current to the amplification circuitry via the cascode node; and
phase shift circuitry coupled to the compensation-current source circuitry and the input amplification circuitry.

6. The apparatus of claim 5, wherein the amplifier is configured to accept an incoming signal and provide an outgoing signal, the amplifier further including:
an input circuit coupled to the input amplification circuitry, the input circuit configured to accept the incoming signal and provide the input signal to the input amplification circuitry based on the incoming signal; and
an output circuit coupled to the cascode amplification circuitry, the output circuit configured to accept the amplified signal from the cascode amplification circuitry and provide the outgoing signal based on the amplified signal.

7. The apparatus of claim 5, wherein
the phase shift circuitry is configured to align a phase of the compensation current with a phase of the input current.

8. The apparatus of claim 7, wherein:
the phase shift circuitry includes a capacitor and a resistor; and
the phase shift circuitry is at least one of:
coupled between a voltage rail and a ground node; or
coupled between the compensation-current source circuitry and the cascode node.

9. The apparatus of claim 5, wherein the compensation circuitry includes:
a compensation transistor coupled to the cascode node;
a bias circuit coupled to the compensation transistor and configured to bias the compensation transistor into an on state or an off state; and
a controller coupled to the bias circuit and configured to cause the bias circuit to turn the compensation transistor on or off based on a band of operation of the amplifier.

10. The apparatus of claim 9, wherein the compensation transistor is configured as a diode-connected transistor.

11. An apparatus for amplification, comprising:
an amplifier including:
amplification circuitry configured to produce an amplified signal based on an input signal, the amplification circuitry including:
a cascode node;
input amplification circuitry coupled to the cascode node, the input amplification circuitry configured to accept the input signal and produce an input current at the cascode node based on the input signal; and
cascode amplification circuitry coupled to the cascode node and configured to produce the amplified signal based on a cascode current at the cascode node; and
compensation circuitry coupled to the cascode node, the compensation circuitry configured to produce a compensation current and apply the compensation current to the amplification circuitry via the cascode node to counteract a component of the input current,
wherein the cascode amplification circuitry includes a regular cascode transistor coupled between an amplification node and the cascode node; and
the compensation circuitry includes:
a compensation cascode transistor coupled between the amplification node and the cascode node; and
a controller coupled to the regular cascode transistor and the compensation cascode transistor, the controller configured to selectively disable the regular cascode transistor and enable the compensation cascode transistor responsive to activation of compensation functionality of the amplifier.

12. The apparatus of claim 11, wherein the compensation cascode transistor is smaller than half a size of the regular cascode transistor.

13. The apparatus of claim 5, wherein:
the input current comprises a second-order input current
the component comprises the second-order input current; and
the compensation circuitry is configured to source the compensation current to counteract the second-order input current.

14. The apparatus of claim 13, wherein the compensation circuitry is configured to counteract the second-order input current by substantially canceling the second-order input current via the cascode node.

15. The apparatus of claim 14, wherein a magnitude of the compensation current is approximately equal to a magnitude of the second-order input current.

16. The apparatus of claim 15, wherein the magnitude of the compensation current is configured to be approximately equal to the magnitude of the second-order input current based on a transconductance value of a compensation transistor of the compensation circuitry and a transconductance value of an input transistor of the input amplification circuitry.

17. The apparatus of claim 14, wherein a phase of the compensation current is approximately opposite a phase of the second-order input current.

18. An amplifier comprising:
amplification circuitry configured to produce an amplified signal based on an input signal, the amplification circuitry including:
a cascode node;
input amplification circuitry coupled to the cascode node, the input amplification circuitry configured to accept the input signal and produce an input current at the cascode node based on the input signal, the input current including a second-order input current; and
cascode amplification circuitry coupled to the cascode node and configured to produce the amplified signal based on a cascode current at the cascode node; and
compensation means for compensating for the second-order input current of the input amplification circuitry via the cascode node.

19. The amplifier of claim 18, wherein the compensation means comprises production means for producing a compensation current to counteract the second-order input current of the input amplification circuitry at the cascode node.

20. The amplifier of claim 19, wherein a phase of the compensation current is configured to be approximately opposite a phase of the second-order input current based on a doping polarity of a compensation transistor of the compensation means being complementary to a doping polarity of an input transistor of the input amplification circuitry.

21. The amplifier of claim 19, wherein the compensation means comprises amplification means for producing the cascode current at the cascode node, the cascode amplification circuitry including the amplification means.

22. The amplifier of claim 21, wherein:
the cascode amplification circuitry includes regular cascode amplification circuitry; and
the compensation means comprises control means for controlling activation of a compensation functionality by switching between the regular cascode amplification circuitry and the amplification means.

23. The amplifier of claim 19, wherein the compensation means comprises phase shift means for aligning a phase of the compensation current with a phase of the second-order input current.

24. A method for amplification with post-distortion compensation, the method comprising:
accepting an input signal at an input transistor;
based on the input signal, producing an input current at a cascode node using the input transistor, the input current including a second-order input current;
based on the input current, causing a cascode current at the cascode node using a cascode transistor;

applying a compensation current at the cascode node to counteract the second-order input current; and producing an amplified signal based on the cascode current.

25. The method of claim 24, further comprising:

combining the input current and the compensation current at the cascode node to produce the cascode current.

26. The method of claim 24, wherein:

the cascode transistor comprises a compensation cascode transistor; and the method further comprises activating a compensation functionality, including:

disabling a regular cascode transistor;

enabling the compensation cascode transistor; and enabling a compensation transistor that is coupled to the cascode node.

27. The method of claim 26, wherein the activating comprises activating the compensation functionality responsive to a signal indicative of a band of operation.

28. The method of claim 26, wherein the enabling of the compensation transistor comprises biasing the compensation transistor to operate in a diode-connected configuration.

29. The method of claim 24, further comprising:

aligning a phase of the second-order input current with a phase of the compensation current using a resistive-capacitive network.

* * * * *